US009843736B2

(12) United States Patent
Evans, V et al.

(10) Patent No.: US 9,843,736 B2
(45) Date of Patent: Dec. 12, 2017

(54) IMAGE CAPTURE WITH A CAMERA INTEGRATED DISPLAY

(71) Applicant: Essential Products, Inc., Palo Alto, CA (US)

(72) Inventors: David John Evans, V, Palo Alto, CA (US); Xinrui Jiang, San Jose, CA (US); Andrew E. Rubin, Los Altos, CA (US); Matthew Hershenson, Los Altos, CA (US); Xiaoyu Miao, Palo Alto, CA (US); Joseph Anthony Tate, San Jose, CA (US); Jason Sean Gagne-Keats, Cupertino, CA (US)

(73) Assignee: ESSENTIAL PRODUCTS, INC., Palo Alto, CA (US)

( * ) Notice: Subject to any disclaimer, the term of this patent is extended or adjusted under 35 U.S.C. 154(b) by 0 days.

(21) Appl. No.: 15/444,320

(22) Filed: Feb. 27, 2017

(65) Prior Publication Data

US 2017/0251137 A1 Aug. 31, 2017

Related U.S. Application Data

(60) Provisional application No. 62/319,099, filed on Apr. 6, 2016, provisional application No. 62/300,631, filed on Feb. 26, 2016.

(51) Int. Cl.
*H04N 5/222* (2006.01)
*H04N 5/235* (2006.01)
(Continued)

(52) U.S. Cl.
CPC ......... *H04N 5/2354* (2013.01); *G02F 1/1368* (2013.01); *G02F 1/13318* (2013.01);
(Continued)

(58) Field of Classification Search
CPC ............... H04N 5/2354; H04N 5/2256; H04N 5/23293; G02F 1/13318; G02F 1/133514; G02F 1/1368
(Continued)

(56) References Cited

U.S. PATENT DOCUMENTS

| 4,928,301 A | 5/1990 | Smoot |
| 5,466,926 A | 11/1995 | Sasano et al. |

(Continued)

FOREIGN PATENT DOCUMENTS

| TW | M480123 U | 6/2014 |
| TW | 201523460 A | 6/2015 |

OTHER PUBLICATIONS

International Search Report and Written Opinion in PCT/US16/59550 dated Jan. 3, 2017, 10 pages.

(Continued)

*Primary Examiner* — Sinh Tran
*Assistant Examiner* — Zhenzhen Wu
(74) *Attorney, Agent, or Firm* — Perkins Coie LLP

(57) ABSTRACT

Certain aspects of the technology disclosed herein integrate a camera with an electronic display. An electronic display includes several layers, such as a cover layer, a color filter layer, a display layer including light emitting diodes or organic light emitting diodes, a thin film transistor layer, etc. A processor initiates light emission from a plurality of display elements. The processor suspends the light emission from the plurality of display elements for a period of time imperceptible to a human observer. The processor initiates a camera to capture an image during the period of time the plurality of display elements are suspended. The processor can capture a plurality of images corresponding to a plurality of pixels and produce an image comprising depth information.

20 Claims, 30 Drawing Sheets

(51) Int. Cl.
| | |
|---|---|
| H04N 5/232 | (2006.01) |
| H04N 5/225 | (2006.01) |
| G02F 1/1335 | (2006.01) |
| G02F 1/133 | (2006.01) |
| G02F 1/1368 | (2006.01) |
| H01L 27/32 | (2006.01) |
| H01L 27/15 | (2006.01) |

(52) U.S. Cl.
CPC ..... *G02F 1/133514* (2013.01); *H04N 5/2256* (2013.01); *H04N 5/23293* (2013.01); *G02F 2001/13312* (2013.01); *H01L 27/156* (2013.01); *H01L 27/3234* (2013.01)

(58) Field of Classification Search
USPC .......... 348/333.01, 333.08, 333.09; 345/175, 345/207
See application file for complete search history.

(56) References Cited

U.S. PATENT DOCUMENTS

| | | | |
|---|---|---|---|
| 5,828,406 A | 10/1998 | Tredwell et al. | |
| 6,107,618 A | 8/2000 | Fossum et al. | |
| 6,627,907 B1 | 9/2003 | Cole et al. | |
| 6,867,821 B2 | 3/2005 | De Schipper | |
| 6,876,143 B2 | 4/2005 | Daniels | |
| 6,885,157 B1 | 4/2005 | Cok et al. | |
| 7,130,011 B2 | 10/2006 | Hsieh et al. | |
| 7,697,053 B2 | 4/2010 | Kurtz et al. | |
| 8,103,085 B1 | 1/2012 | Zadeh | |
| 8,576,325 B2* | 11/2013 | Dudek | H04N 7/144 345/632 |
| 8,867,015 B2 | 10/2014 | Posner et al. | |
| 9,057,931 B1 | 6/2015 | Baldwin | |
| 9,204,089 B2* | 12/2015 | Nagano | H04N 7/144 |
| 2002/0089467 A1 | 7/2002 | Hara | |
| 2004/0212555 A1 | 10/2004 | Falco | |
| 2004/0257473 A1* | 12/2004 | Miyagawa | H04N 7/144 348/571 |
| 2006/0136846 A1 | 6/2006 | Im et al. | |
| 2007/0002130 A1 | 1/2007 | Hartkop | |
| 2007/0081094 A1 | 4/2007 | Ciudad et al. | |
| 2007/0109239 A1 | 5/2007 | Den Boer et al. | |
| 2007/0247439 A1 | 10/2007 | Daniel et al. | |
| 2008/0068484 A1* | 3/2008 | Nam | H04N 5/23293 348/333.01 |
| 2008/0106628 A1* | 5/2008 | Cok | H04N 7/144 348/333.01 |
| 2008/0165267 A1 | 7/2008 | Cok | |
| 2008/0292144 A1 | 11/2008 | Kim | |
| 2009/0102763 A1 | 4/2009 | Border et al. | |
| 2009/0121619 A1 | 5/2009 | Rajan et al. | |
| 2009/0153652 A1 | 6/2009 | Barenbrug | |
| 2009/0322706 A1 | 12/2009 | Austin | |
| 2010/0044121 A1 | 2/2010 | Simon et al. | |
| 2010/0060552 A1 | 3/2010 | Watanabe et al. | |
| 2010/0073518 A1 | 3/2010 | Yeh | |
| 2010/0118179 A1 | 5/2010 | Ciudad et al. | |
| 2010/0182446 A1* | 7/2010 | Matsubayashi | H04N 5/23229 348/222.1 |
| 2011/0164047 A1 | 7/2011 | Pance | |
| 2011/0248155 A1 | 10/2011 | Chen | |
| 2011/0279689 A1* | 11/2011 | Maglaque | H04N 5/2253 348/207.1 |
| 2012/0074227 A1 | 3/2012 | Ferren et al. | |
| 2012/0105400 A1 | 5/2012 | Mathew et al. | |
| 2012/0287327 A1 | 11/2012 | Border et al. | |
| 2013/0135268 A1 | 5/2013 | Kanade et al. | |
| 2013/0135328 A1 | 5/2013 | Rappoport et al. | |
| 2013/0147764 A1 | 6/2013 | Chaji et al. | |
| 2013/0182062 A1 | 7/2013 | Son et al. | |
| 2013/0207896 A1 | 8/2013 | Robinson et al. | |
| 2013/0221856 A1 | 8/2013 | Soto | |
| 2013/0242479 A1 | 9/2013 | Yoo et al. | |
| 2013/0251215 A1 | 9/2013 | Coons | |
| 2013/0278516 A1 | 10/2013 | Nagata et al. | |
| 2013/0322752 A1 | 12/2013 | Lim et al. | |
| 2014/0036168 A1 | 2/2014 | Ludwig | |
| 2014/0208417 A1 | 7/2014 | Robison | |
| 2014/0232956 A1 | 8/2014 | Kwon et al. | |
| 2014/0267850 A1 | 9/2014 | Li et al. | |
| 2015/0035936 A1 | 2/2015 | Robinson et al. | |
| 2015/0049165 A1 | 2/2015 | Choi | |
| 2015/0212583 A1 | 7/2015 | Shen et al. | |
| 2015/0271392 A1 | 9/2015 | Musgrave et al. | |
| 2015/0279020 A1 | 10/2015 | Gupta et al. | |
| 2016/0180837 A1 | 6/2016 | Gustavsson et al. | |
| 2017/0123452 A1 | 5/2017 | Evans et al. | |
| 2017/0123453 A1 | 5/2017 | Evans et al. | |
| 2017/0123454 A1 | 5/2017 | Evans et al. | |
| 2017/0124932 A1 | 5/2017 | Evans et al. | |
| 2017/0124933 A1 | 5/2017 | Evans et al. | |
| 2017/0124942 A1 | 5/2017 | Evans et al. | |
| 2017/0171448 A1 | 6/2017 | Evans et al. | |

OTHER PUBLICATIONS

International Search Report and Written Opinion in PCT/US16/58543 dated Jan. 3, 2017, 12 pages.
International Search Report and Written Opinion in PCT/US16/58545 dated Jan. 3, 2017, 12 pages.
International Search Report and Written Opinion in PCT/US16/58548 dated Jan. 19, 2017, 8 pages.
International Search Report and Written Opinion in PCT/US16/58947 dated Jan. 13, 2017, 9 pages.
Evans V, et al., International Search Report and Written Opinion received in PCT Application No. PCT/US16/59524, dated Feb. 27, 2017; 10 pages.
Evans V, et al., Non-Final Office Action mailed in U.S. Appl. No. 15/336,380, dated Mar. 14, 2017; 17 pages.
Evans V, et al., Non-Final Office Action received in U.S. Appl. No. 15/231,652, dated Feb. 24, 2017; 26 pages.
Evans V, et al., "Camera Integrated Into a Display", Non-Final Office Action mailed in U.S. Appl. No. 15/231,664, dated Feb. 16, 2017; 27 pages.
Non-Final Office Action datedd Jan. 5, 2017 in U.S. Appl. No. 15/231,643 of Evans et al. filed Aug. 8, 2016, 37 pages.
Final Office Action dated Apr. 18, 2017 in U.S. Appl. No. 15/283,204 of Evans et al. filed Sep. 30, 2016, 17 pages.
Final Office Action dated Apr. 26, 2017 in U.S. Appl. No. 15/231,652 of Evans et al. filed Aug. 8, 2016, 32 pages.
Non-Final Office Action dated Dec. 2, 2016 in U.S. Appl. No. 15/283,204 of Evans et al. filed Sep. 30, 2016, 12 pages.
Non-Final Office Action dated Dec. 15, 2016 in U.S. Appl. No. 15/283,112 of Evans et al. filed Sep. 30, 2016, 26 pages.
Final Office Action dated Mar. 31, 2017 in U.S. Appl. No. 15/231,643 of Evans et al. filed Aug. 8, 2016, 32 pages.
Final Office Action dated Apr. 11, 2017 in U.S. Appl. No. 15/231,664 of Evans et al. filed Aug. 8, 2016, 36 pages.
Advisory Action dated May 30, 2017, for U.S. Appl. No. 15/231,664 of Evans, D.J. et al. filed Aug. 8, 2016.
Non-Final Office Action dated Jun. 26, 2017, for U.S. Appl. No. 15/442,576 of Evans et al. filed Feb. 24, 2017.
Non-Final Office Action dated Jun. 6, 2017 for U.S. Appl. No. 15/231,643 of Evans, D.J. et al. filed Aug. 8, 2016.
Non-Final Office Action dated Jun. 23, 2017 in U.S. Appl. No. 15/231,664 of Evans et al.
Notice of Allowance dated May 19, 2017, for U.S. Appl. No. 15/283,112 of Evans et al. filed Sep. 30, 2016, 8 pages.
Notice of Allowance dated May 26, 2017, for U.S. Appl. No. 15/336,380 of Evans, J.D. et al. filed Oct. 27, 2017.
Advisory Action dated May 12, 2017, for U.S. Appl. No. 15/231,643 of Evans.
International Search Report and Written Opinion dated May 18, 2017, for International Application No. PCT/US2017/19790 filed Feb. 27, 2017, 8 pages.

(56) References Cited

OTHER PUBLICATIONS

Advisory Action dated Jul. 6, 2017, for U.S. Appl. No. 15/283,204 of Evans et al. filed Sep. 30, 2016.
Notice of Allowance dated Jul. 14, 2017 in U.S. Appl. No. 15/231,652 of Evans et al. filed Aug. 8, 2016.
Non-Final Office Action dated Sep. 19, 2017 for U.S. Appl. No. 15/283,204 of Evans et al. filed Sep. 30, 2016.
Notice of Allowance dated Sep. 13, 2017 for U.S. Appl. No. 15/231,664 of Evans et al. filed Aug. 3, 2016.
Non-Final Office Action dated Sep. 21, 2017 for TW Application No. 105134992 of Evans et al., filed Oct. 28, 2016.

\* cited by examiner

A. 1xR 1xG 1xB
B. 1xR 2xG 1xB
C. 1xR 1xG 1xB 1xW
D. 1xALL (coarse)
E. 1xR 1xG 1xB 1xI.R.
F. ALL OPTIONS
G. Multiple for 3D/Parallax
H. Multiple for 200M/Refocus
I. Add I.R. LED Laser for Distance/Time of Flight

IMAGE CAPTURE WITH A CAMERA INTEGRATED DISPLAY

CROSS-REFERENCE TO RELATED APPLICATIONS

This application claims priority to the U.S. Provisional Patent Application Ser. No. 62/300,631, filed Feb. 26, 2016, and to the U.S. Provisional Patent Application Ser. No. 62/319,099, filed Apr. 6, 2016, both of which are incorporated herein by reference in their entirety.

TECHNICAL FIELD

The present application is related to cameras, and more specifically to methods and systems for image capture in a camera integrated display.

BACKGROUND

Present day cameras and electronic displays, when integrated into the same device, occupy separate regions of the device. The region of the device associated with the camera does not function as a display, while the region of the device functioning as the electronic display does not function as a camera.

SUMMARY

Certain aspects of the technology disclosed herein integrate a camera with an electronic display. An electronic display includes several layers, such as a cover layer, a color filter layer, a display layer including light emitting diodes or organic light emitting diodes, a thin film transistor layer, etc. In one embodiment, the layers include a substantially transparent region disposed above the camera. The substantially transparent region allows light from outside to reach the camera, enabling the camera to record an image. In another embodiment, the color filter layer does not include a substantially transparent region, and the camera records the light from the outside colored by the color filter layer. According to another embodiment, while none of the layers include a substantially transparent region, the layers are all substantially transparent, and the camera disposed beneath the layers records light reaching the camera from outside the camera integrated display.

Embodiments include suspending light emission from all or a portion of a display to improve image capture by a camera integrated into a display. Light emission from display elements can interfere with image capture in a camera integrated display. A processor initiates light emission from a plurality of display elements. The processor suspends light emission from the plurality of display elements for a period of time imperceptible to a human observer. The processor initiates a camera to capture an image during the period of time the plurality of display elements are suspended. The processor captures a plurality of images corresponding to a plurality of pixels and produces an image comprising depth information.

BRIEF DESCRIPTION OF THE DRAWINGS

These and other objects, features and characteristics of the present embodiments will become more apparent to those skilled in the art from a study of the following detailed description in conjunction with the appended claims and drawings, all of which form a part of this specification. While the accompanying drawings include illustrations of various embodiments, the drawings are not intended to limit the claimed subject matter.

DETAILED DESCRIPTION

Terminology

Figure 1A:
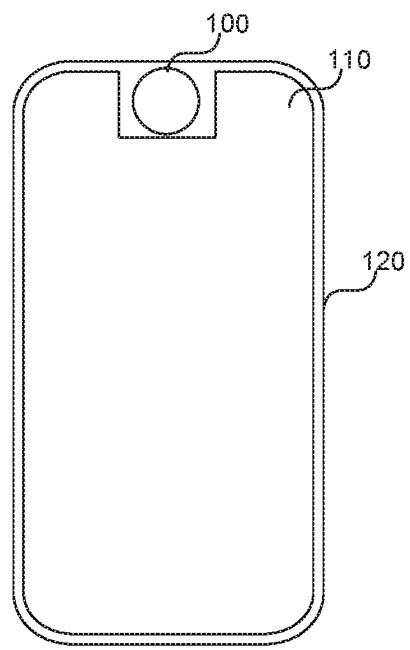
FIG. 1A shows a camera integrated into a mobile display, according to one embodiment.

Brief definitions of terms, abbreviations, and phrases used throughout this application are given below.

A "camera" is an imaging device configured to record light from an environment surrounding the imaging device in order to produce an image. The image can be a static picture or a video. The image can be a 3-dimensional image, a stereoscopic image, a 360° image, etc.

Reference in this specification to "one embodiment" or "an embodiment" means that a particular feature, structure, or characteristic described in connection with the embodiment is included in at least one embodiment in of the disclosure. The appearances of the phrase "in one embodiment" in various places in the specification are not necessarily all referring to the same embodiment, nor are separate or alternative embodiments mutually exclusive of other embodiments. Moreover, various features are described that may be exhibited by some embodiments and not by others. Similarly, various requirements are described that may be requirements for some embodiments but not others.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements. The coupling or connection between the elements can be physical, logical, or a combination thereof. For example, two devices may be coupled directly, or via one or more intermediary channels or devices. As another example, devices may be coupled in such a way that information can be passed there between, while not sharing any physical connection with one another. Additionally, the words "herein," "above," "below," and words of similar import, when used in this application, shall refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

If the specification states a component or feature "may," "can," "could," or "might" be included or have a characteristic, that particular component or feature is not required to be included or have the characteristic.

The term "module" refers broadly to software, hardware, or firmware components (or any combination thereof). Modules are typically functional components that can generate useful data or another output using specified input(s). A module may or may not be self-contained. An application program (also called an "application") may include one or more modules, or a module may include one or more application programs.

The terminology used in the Detailed Description is intended to be interpreted in its broadest reasonable manner, even though it is being used in conjunction with certain examples. The terms used in this specification generally have their ordinary meanings in the art, within the context of the disclosure, and in the specific context where each term is used. For convenience, certain terms may be highlighted, for example using capitalization, italics, and/or quotation marks. The use of highlighting has no influence on the scope and meaning of a term; the scope and meaning of a term is the same, in the same context, whether or not it is highlighted. It will be appreciated that the same element can be described in more than one way.

Consequently, alternative language and synonyms may be used for any one or more of the terms discussed herein, but special significance is not to be placed upon whether or not a term is elaborated or discussed herein. A recital of one or more synonyms does not exclude the use of other synonyms. The use of examples anywhere in this specification, including examples of any terms discussed herein, is illustrative only and is not intended to further limit the scope and meaning of the disclosure or of any exemplified term. Likewise, the disclosure is not limited to various embodiments given in this specification.

Overview

A flat screen display includes several layers, such as the substantially transparent cover layer, the color filter (CF) layer, the display layer, the thin film transistor (TFT) layer, etc., stacked on top of each other to create a colored image. The substantially transparent cover layer is the top layer associated with a display, and the layer with which the user interacts. Beneath the substantially transparent cover layer is the CF layer including color regions such as a red, a green, and a blue color region. The purpose of the CF layer is to color the light emitted by the layers underneath it, in order to create a color display.

The display layer can take any suitable form such as a liquid crystal display (LCD) layer, an light emitting diode (LED) display layer, etc. An LED display layer includes, for example, organic light-emitting diode (OLED), active-matrix organic light-emitting diode (AMOLED), quantum-dot-based light-emitting diode (QLED), etc. Reference to any display technology is by way of example and not intended to be limiting. For example, discussion of an OLED layer can be applicable to a QLED layer.

The LCD layer includes liquid crystals that can assume at least two arrangements. In the first arrangement, the liquid crystals transmit the light emitted by a back light layer underneath the LCD layer, and in the second arrangement the liquid crystals block the light emitted by the back light underneath the LCD layer. The OLED layer includes organic light emitting diodes that when activated emit colored light, such as red, green, or blue light. The OLED layer does not require a back light layer because the OLEDs can emit light.

The TFT layer is an array of thin-film transistors corresponding to the color regions associated with the CF layer. The transistors in the TFT layer can cause the liquid crystals to transmit the back light, or to block the back light. Also, the transistors can cause the OLEDs to emit light, or to stop emitting light.

Light emission from display elements can interfere with image capture in a camera integrated display. For example, light emission from display elements may produce glare or otherwise obstruct image capture. A processor can be electrically connected to the TFT layer and manipulate one or more thin-film transistors to cause display elements to turn off and on. For example, the processor can cause an electric charge of the one or more thin-film transistors to rapidly change from a first state (e.g., 1 causing an "on" state) to a second state (e.g., 0 causing an "off" state) and back to a first state (e.g., 1 again). Causing the electric charge of the thin-film transistors to rapidly change from one state to another and back again can be used to turn a display off (or any portion of a display off) for such a short period of time that a viewer cannot perceive that the display (or any portion thereof) is turned off. For example, the display can be turned off for ⅟₆₀th of a second. While light emission from the display is turned off, a camera positioned in the display can capture an image unobstructed by light from the display. Capturing an image while light is not emitted from the display can enhance a quality of image captured from a camera integrated into a display.

Camera Integrated into the Display

FIG. 1A shows a camera integrated into a smart phone display, according to one embodiment. A display 110 associated with a device 120, such as a mobile device, a stand-alone camera device, or any kind of device comprising a display, includes a camera 100. The display 110 surrounds the camera 100. The camera 100 can be placed anywhere on the display 110, such as the middle of the upper edge of the display 110 as shown in FIG. 1A, the upper right corner of the display, the upper left corner of the display, the bottom right corner of display, etc. The display 110 can include one or more cameras, such as the camera 100. The portion of the display 110 nearest to the camera 100 can be reserved for operating system icons associated with a device, such as the battery icon, etc., or the portion of the display 110 nearest to the camera 100 can be used for application icons not associated with the operating system.

The camera 100 can represent a camera icon associated with the display 110. When the camera icon is selected, such as by touch selection, the camera icon can be configured to activate the camera 100 such as by activating an application associated with the camera 100, or by activating the camera 100 to record an image. The display 110 can take on any arbitrary two-dimensional or three-dimensional shape. For example, the display 110 can be a rounded rectangle, a circle, a half round shape, an ellipsoid, a cuboid, etc. The camera 100 can comprise a plurality of smaller noncontiguous cameras (i.e. a plurality of smaller noncontiguous pixel regions) distributed throughout the display 110.

Figure 1B:
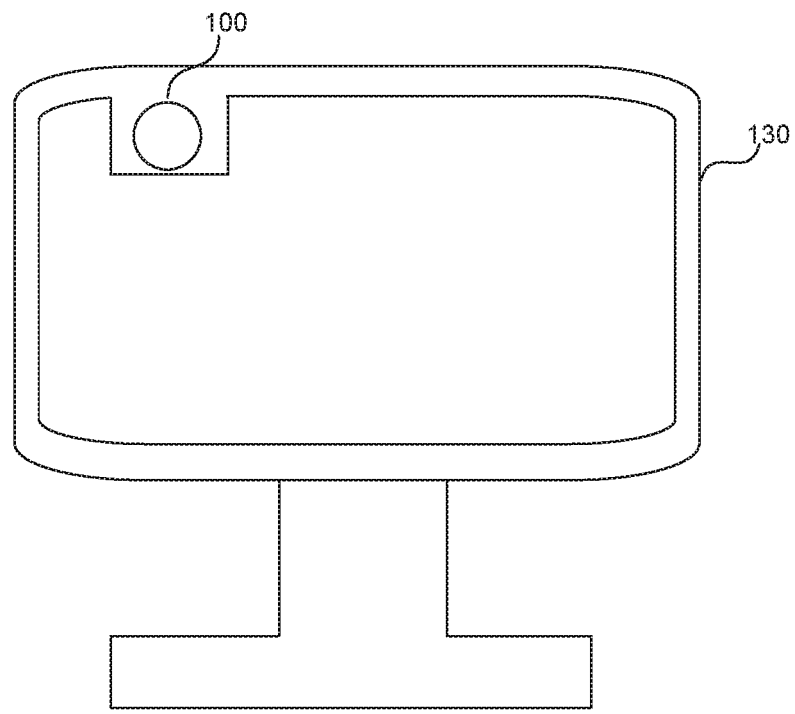
FIG. 1B shows a camera integrated into a desktop display, according to one embodiment.

FIG. 1B shows a camera integrated into a desktop display, according to one embodiment. A monitor 130 associated with a computer, such as a desktop computer, includes a camera 100. The monitor 130 surrounds the camera 100. The camera 100 can be placed anywhere on the monitor 130, such as in the upper left corner of the monitor 130, the middle of the lower edge of the monitor 130, the lower right corner of the monitor 130, the left side of the monitor 130, etc. The monitor 130 can include one or more cameras, such as the camera 100.

Figure 2A:
FIGS. 2A-2B show a cross-section of the camera integrated into a display, according to one embodiment.
Figure 2B:
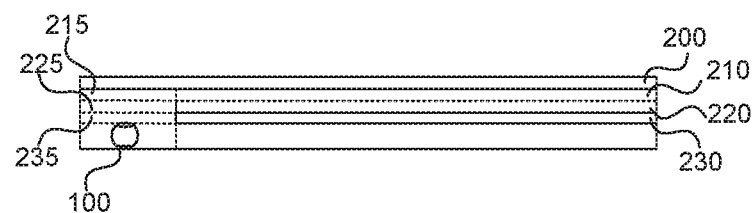

FIGS. 2A-2B show a cross-section of the camera 100 integrated into the display 110, according to one embodiment. The display 110 includes a substantially transparent cover layer 200, an optional color filter layer 210, a display layer 220, and a thin film transistor layer 230. The substantially transparent cover layer 200 defines an outside surface associated with the display 110. The cover layer 200 can be made out of any substantially transparent material, such as glass, plastic, polymer, etc.

An optional color filter (CF) layer 210 is disposed beneath the substantially transparent cover layer 200. The CF layer 210 includes a CF substrate and a plurality of color regions disposed on the CF substrate. The plurality of color regions corresponds to any set of colors capable of reproducing, alone or in combination, substantially the full visible light spectrum. The set of colors can be red, green, and blue (RGB); red, green, blue, and white (RGBW), where a white region transmits substantially the full electromagnetic spectrum; red, green, blue, and infrared (IR), where the IR region transmits substantially the IR part of the electromagnetic spectrum; cyan, magenta, and yellow (CMYK), etc. The CF layer 210 includes a substantially transparent region 215 shown in FIG. 2B suitable for exposing the camera 100 by allowing light from outside environment to reach the camera 100. The substantially transparent region 215 can be a via formed in the CF layer 210, can be a hole, can be a CF substrate region substantially without any colors, can be a CF substrate region with camera pixels disposed on the CF substrate region and the CF substrate region substantially without any colors, etc. An infrared (IR) sensor can be placed beneath the white color region, the IR region, or beneath the substantially transparent region 215. An ambient sensor, or a pixel associated with the camera 100 can be placed beneath the white color region, or beneath the substantially transparent region 215.

A display layer 220, disposed beneath the cover layer 200, includes a display substrate and a plurality of display elements disposed on the display substrate. The plurality of display elements are configured to transmit light. The light transmission includes generation of light by the display elements, or allowing the light generated by other layers to pass through the display elements. The display layer 220 can be transparent.

The display layer 220 can be a liquid crystal display (LCD) layer including an LCD substrate and a plurality of liquid crystals disposed on the LCD substrate. Also, the display layer 220 can be an organic light emitting diode (OLED) layer including an OLED substrate and a plurality of OLEDs disposed on the OLED substrate. The display layer 220 includes a substantially transparent region 225 shown in FIG. 2B suitable for exposing the camera 100 by allowing light from outside environment to reach the camera 100. The substantially transparent region 225 can be a via formed in the display layer 220, can be a hole, can be a display substrate substantially without any display elements, can be a display substrate with camera pixels disposed on the display substrate and without any display elements, etc.

A thin film transistor (TFT) layer 230 disposed beneath the display layer 220, includes a TFT substrate and a plurality of TFTs disposed on the TFT substrate. The TFT layer 230 can be transparent. The TFT layer 230 includes a substantially transparent region 235 shown in FIG. 2B suitable for exposing the camera 100 by allowing light from outside environment to reach the camera 100. The substantially transparent region 235 can be a via formed in the TFT layer 230, can be a hole, can be a TFT substrate substantially without any transistors, or can be a TFT substrate with camera pixels disposed on the TFT substrate and without any transistors.

The camera 100 is disposed beneath the substantially transparent cover layer 200 and is proximate to the optional CF layer 210, the display layer 220, and the TFT layer 230. The camera 100 can be placed beneath one or more layers 210, 220, 230, such as beneath all the layers 210, 220, 230 shown in FIG. 2B, or the camera can be placed next to one or more layers 210, 220, 230, such as next to all the layers 210, 220, 230 shown in FIG. 2A.

The layers 210, 220, 230 with the substantially transparent regions 215, 225, 235 are arranged and coupled such that the substantially transparent region 215, 225, 235 extends through the CF layer 210, the display layer 220, and the TFT layer 230, wherein the substantially transparent region 215, 225, 235 faces the camera 100 and exposes the camera 100 to allow light from outside environment to reach the camera 100. The shape of the layers 200, 210, 220, 230 can follow the shape of the display 110 and can be any arbitrary two-dimensional or three-dimensional shape, such as a rounded rectangle, a circle, a half round shape, an ellipsoid, a cuboid, etc. The substantially transparent region 215, 225, 235 can be a via, a hole, a substrate substantially without any elements deposited on the substrate, a substrate with camera pixels disposed on the substrate and without any other elements, etc. The substantially transparent region 215, 225, 235 can take on any shape such as a circle, a parallelogram, etc. The substantially transparent region 215, 225, 235 can comprise a plurality of smaller noncontiguous substantially transparent regions distributed throughout the layers 210, 220, 230. The size of the smaller noncontiguous substantially transparent region can vary from the size of the camera pixel to almost the size of the whole substantially transparent region 215, 225, 235. The layers 200, 210, 220, 230 can be configured to be flexible.

Figure 3:
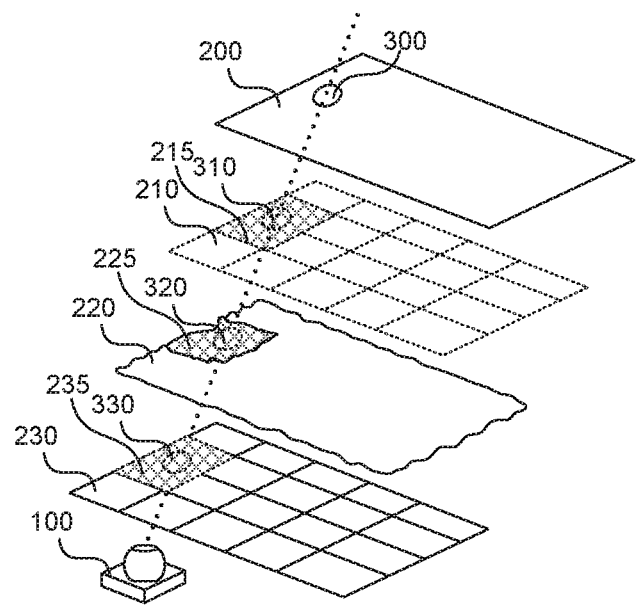
FIG. 3 shows a plurality of layers associated with the camera including a lens placed above the camera, according to one embodiment.

FIG. 3 shows a plurality of layers associated with the camera including one or more lenses placed above the camera, according to one embodiment. The one or more lenses 300 focuses a light beam onto the camera 100. The one or more lenses 300 corresponds to one or more pixels associated with the camera 100. The layers 210, 220, 230 can also include one or more lenses 310, 320, 330, respectively, associated with the substantially transparent regions 215, 225, 235 to further focus the light beam onto the camera 100. When the substantially transparent region 215, 225, 235 comprises the plurality of smaller noncontiguous substantially transparent regions, the layers 210, 220, 230 can include a plurality of lenses corresponding to the plurality of smaller noncontiguous substantially transparent regions. The lenses 300, 310, 320, 330 can have any focal length, from an extremely small effective focal length to an extremely long effective focal length.

In various embodiments disclosed herein, a processor is configured to gather a plurality of images corresponding to the plurality of pixels, and to produce an image comprising depth information.

Figure 4A:
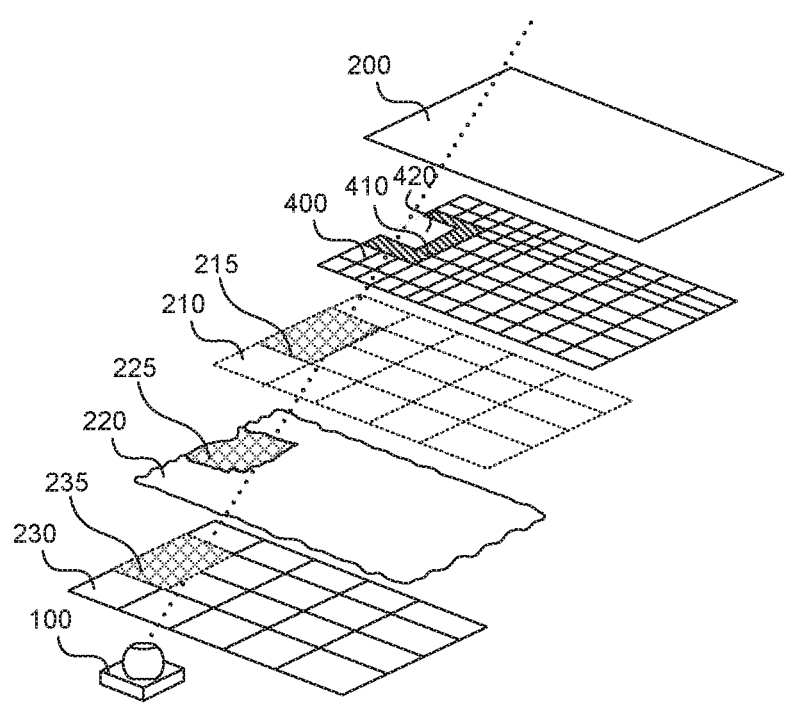
FIG. 4A shows a touch sensor layer 400, according to one embodiment.

FIG. 4A shows a touch sensor layer 400, according to one embodiment. The touch sensor layer 400 comprises touch sensors associated with a standalone layer, or touch sensors associated with any of the layers 200, 210, 220, 230. The touch sensors can be capacitive, or resistive, or any other type of touch sensors.

The touch sensor layer 400 can be a separate layer, as shown in FIG. 4A, and can be placed between any of the layers 200, 210, 220, 230. For example, the touch sensor layer 400 can be placed between the cover layer 200 and the optional CF layer 210, or the touch sensor layer 400 can be placed between the optional CF layer 210 and display layer 220, etc.

Figure 6A:
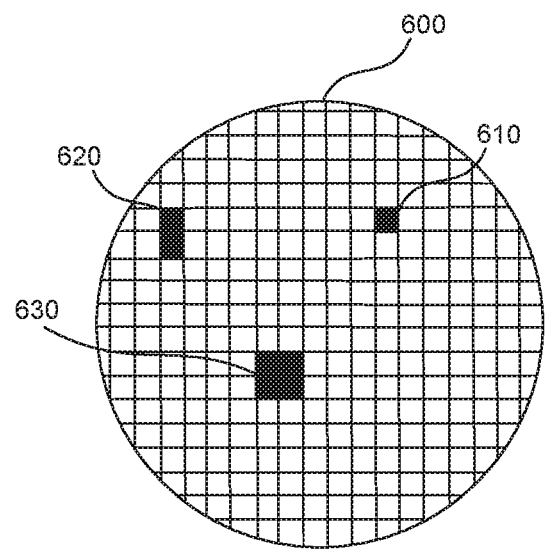
FIG. 6A shows the placement of various sensors dispersed throughout the plurality of pixels associated with the camera, according to one embodiment.
Figure 6B:
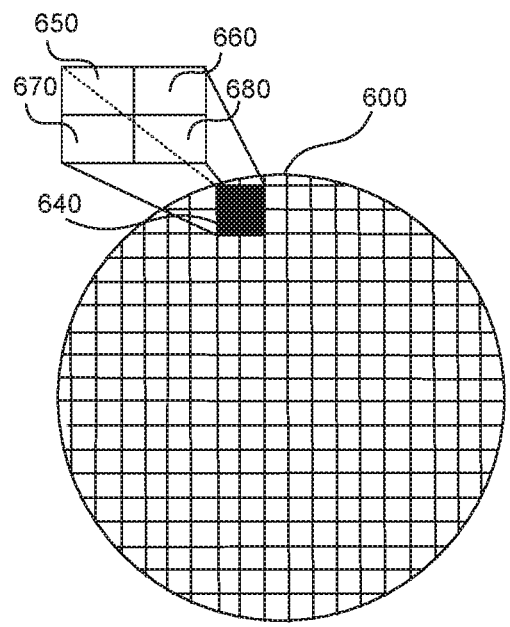
FIG. 6B shows the placement of various sensors and pixels within the plurality of pixels associated with the camera, according to one embodiment.

The touch sensor layer 400 can comprise a plurality of noncontiguous touch sensor regions integrated into any of the layers 200, 210, 220, 230. For example, the touch sensors can be dispersed throughout the layers 200, 210, 220, 230. In another embodiment, the touch sensors can be dispersed throughout the pixels associated with the camera 100, as shown in FIGS. 6A-6B. According to one embodiment, touch sensor layer 400 includes a substantially transparent region 420 placed above the substantially transparent regions 215, 225, 235 associated with the layers 210, 220, 230 respectively. The substantially transparent region 420 includes a region 410 comprising touch sensors. The region 410 associated with the touch sensor layer 400, overlaps the substantially transparent regions 215, 225, 235 associated with layers 210, 220, 230 respectively, along the boundary associated with the substantially transparent regions 215, 225, 235. According to another embodiment, the region 410 overlaps the substantially transparent regions 225, 235, and the region 410 is non-contiguous. Region 410 is placed above the camera 100 and includes touch sensors that when activated in turn activate the camera 100 to perform various actions such as to record an image of an object activating the touch sensor, or to activate an application associated with the camera 100.

For example, when the touch sensors disposed above the camera, such as touch sensors in the region 410, are activated and the device 120 is locked, the camera 100 can act as a fingerprint sensor by taking a picture of the object activating the touch sensor. A processor coupled to the camera 100 can compare a recorded picture to an image of a fingerprint authorized to unlock the device 120.

Figure 4B:
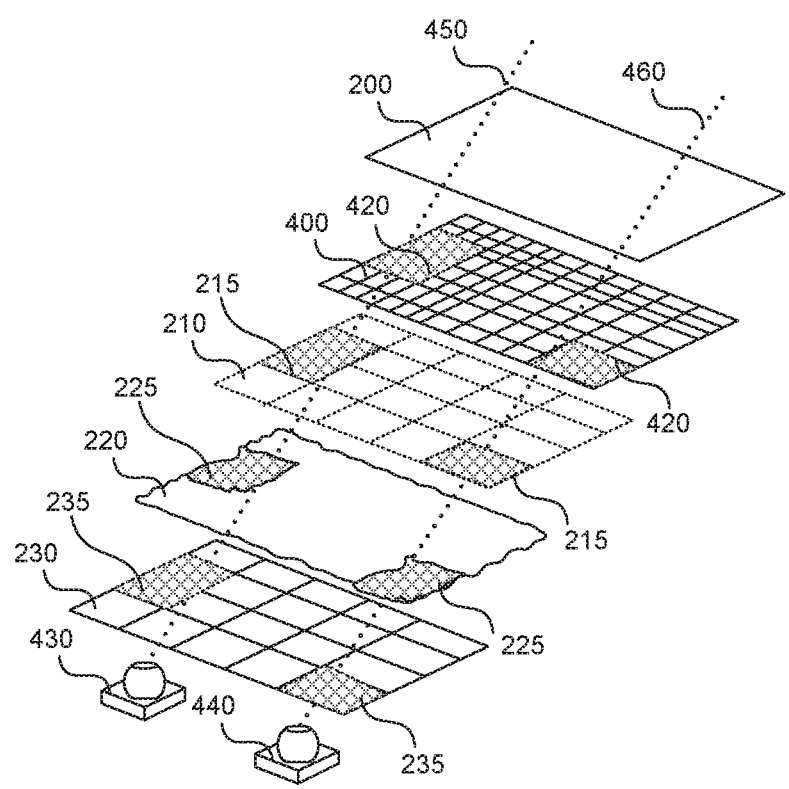
FIG. 4B shows noncontiguous cameras placed beneath a plurality of layers, according to one embodiment.

FIG. 4B shows noncontiguous cameras 430, 440 placed beneath a plurality of layers, according to one embodiment. Camera 100 can comprise noncontiguous cameras 430, 440. Cameras 430, 440 can be placed beneath the substantially transparent cover layer 200, the optional CF layer 210, the display layer 220, the TFT layer 230, the touch sensor layer 400. Cameras 430, 440 can be placed proximate to the layers 210, 220, 230. For example, if the substantially transparent regions 215, 225, 235 are holes, the noncontiguous cameras 430, 440 can be placed inside the substantially transparent regions 215, 225, 235. In another embodiment, the noncontiguous cameras 430, 440 can be placed on a substrate associated with the layers 210, 220, 230.

According to one embodiment, the layers 210, 220, 230, 400 comprise substantially transparent regions 215, 225, 235, 420 respectively, placed above the cameras 430, 440. Each substantially transparent region 215, 225, 235, 420 can include zero or more lenses (not pictured) to focus light beams 450, 460 coming from outside to the cameras 430, 440.

Figure 5:
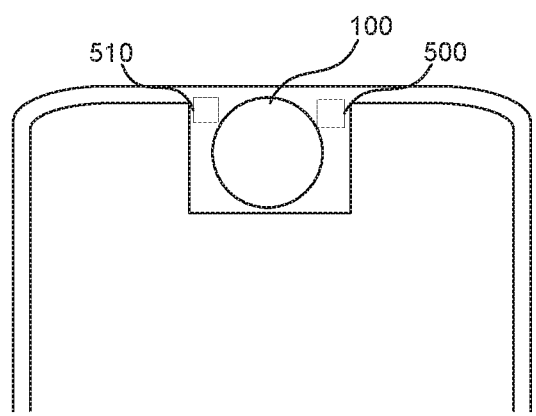
FIG. 5 shows the placement of various sensors proximate to the camera, according to one embodiment.

FIG. 5 shows the placement of various sensors 500, 510 proximate to the camera 100, according to one embodiment. The various sensors 500, 510 can be an ambient light sensor, an infrared (IR) receiver, an IR emitter, or a touch sensor. The IR sensor can be used for proximity sensing, distance sensing, and/or time of flight. The IR sensor can be a light emitting diode (LED), a laser, an LED laser, etc. The various sensors 500, 510 can be placed to overlap the substantially transparent regions 215, 225, 235 associated with layers 210, 220, 230 respectively including being placed over the camera 100.

FIG. 6A shows the placement of various sensors dispersed throughout the plurality of pixels 600 associated with the camera 100, according to one embodiment. The camera 100 comprises a plurality of pixels 600 disposed on a camera substrate. Instead of pixels, the camera substrate can receive various sensors 610, 620, 630, such as an IR sensor, touch sensor, ambient light sensor, etc.

FIG. 6B shows the placement of various sensors and pixels within the plurality of pixels 600 associated with the camera 100, according to one embodiment. The plurality of pixels 600 comprises a plurality of regions, wherein each region 640 in the plurality of regions includes four subregions, 650, 660, 670, 680. The region 640 can have a square shape, a rectangular shape, a slanted line shape as shown in FIG. 12C, etc. According to one embodiment, the plurality of regions tiles the plurality of pixels 600. Each subregion 650, 660, 670, 680 corresponds to either a pixel or a sensor, such as an IR sensor, touch sensor, ambient light sensor, etc. In one embodiment, subregion 650 corresponds to a red pixel, subregions 660, 670 correspond to a green pixel, and subregion 680 corresponds to a blue pixel. In another embodiment, one of the subregions 650, 660, 670, 680 corresponds to a white pixel, an IR sensor, a touch sensor, an ambient light sensor, etc.

In another embodiment, the subregions 650, 660, 670, 680 correspond to a single pixel configured to record red, green, blue light; or red, green, blue, white light; or cyan, magenta, yellow light, etc.

Further, each pixel in the plurality of pixels 600 comprises a lens and a photodetector. The plurality of lenses corresponding to the plurality of pixels 600 can have various focal lengths from extremely short focal lengths to extremely long focal lengths, and can focus light coming from different depths away from the camera 100. A processor is configured to gather a plurality of images corresponding to the plurality of pixels 600 in FIGS. 6A-6B, and to produce an image comprising depth information, such as a stereoscopic image, a depth map, etc.

Figure 7:
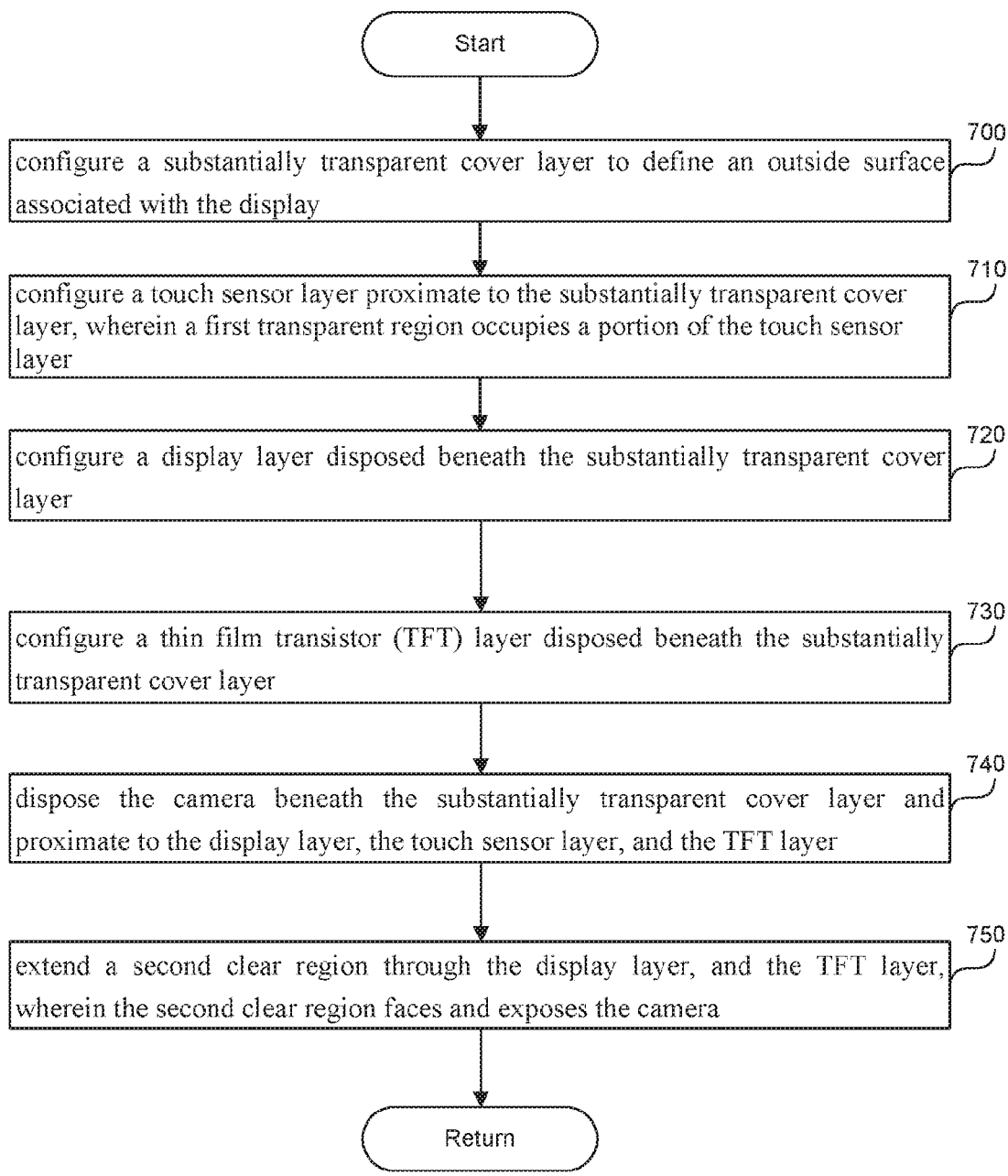
FIG. 7 is a flowchart of a method to integrate a camera into a display, according to one embodiment.

FIG. 7 is a flowchart of a method to integrate a camera 100 into a display 110, according to one embodiment. In step 700, a substantially transparent cover layer 200 is configured to define an outside surface associated with the display 110. The substantially transparent cover layer 200 can be made out of glass, transparent plastic, transparent polymer, etc.

In step 710, a touch sensor layer 400 is configured to be proximate to the substantially transparent cover layer 200. The touch sensor layer 400 comprises a touch sensor substrate, and a plurality of touch sensors, wherein a first substantially transparent region occupies a portion of the touch sensor layer 400.

In step 720, a display layer 220 is configured to be disposed beneath the substantially transparent cover layer 200. The display layer 220 comprises a display substrate and a plurality of display elements disposed on the display substrate, wherein the plurality of display elements is configured to transmit light. The light transmission includes generation of light by the display elements, or allowing the light generated by other layers to pass through the display elements. The display layer 220 can be a liquid crystal display (LCD) layer including an LCD substrate and a plurality of liquid crystals disposed on the LCD substrate. Also, the display layer 220 can be an organic light emitting diode (OLED) layer including an OLED substrate and a plurality of OLEDs disposed on the OLED substrate.

In step 730, a thin film transistor (TFT) layer 230 is disposed beneath the display layer 220, the TFT layer 230 comprising a TFT substrate and a plurality of TFTs disposed on the TFT substrate.

In step 740, the camera 100 is disposed beneath the substantially transparent cover layer 200 and proximate to the display layer 220, the touch sensor layer 400, and the TFT layer 230.

In step 750, a second substantially transparent region is extended through the display layer 220, and the TFT layer 230, wherein the second substantially transparent region faces and exposes the camera 100, and wherein the second substantially transparent region encompasses the first substantially transparent region. The second substantially transparent region can be concentric with the first substantially transparent region. An area associated with the touch sensor layer 400 comprising a difference between the first substantially transparent region and the second substantially transparent region comprises a touch sensor.

Other method steps can be performed to create various embodiments disclosed herein.

Camera Integrated into the Display Beneath the Color Filter Layer

Figure 8A:
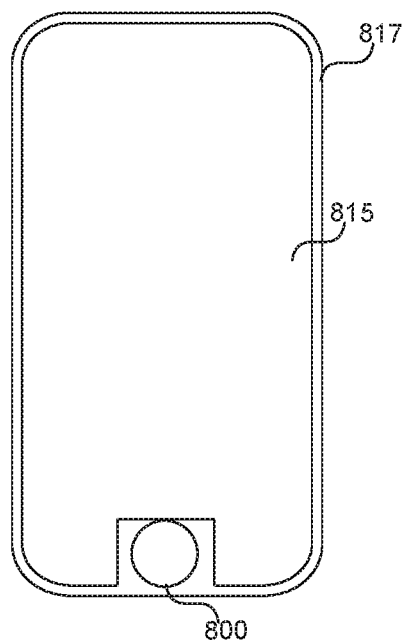
FIG. 8A shows a camera integrated into a smart phone display, according to one embodiment.

FIG. 8A shows a camera integrated into a smart phone display, according to one embodiment. A display 815 associated with a device 817, such as a mobile device, a stand-alone camera device, or any kind of device comprising a display, includes a camera 800. The display 815 surrounds the camera 800. The camera 800 can be placed anywhere on the display 815, such as the middle of the lower edge of the display 815, the upper left corner of the display, the upper right corner of the display, the bottom left corner of display, etc. The display 815 can include one or more cameras, such as the camera 800. The portion of the display 815 nearest to the camera 800 can be reserved for operating system icons associated with a device, such as the battery icon, etc., or the portion of the display 815 nearest to the camera 800 can be used for application icons not associated with the operating system.

The camera 800 can represent a camera icon associated with the display 815. When the camera icon is selected, such as by touch selection, the camera icon can be configured to activate the camera 800 such as by activating an application associated with the camera 800, or by activating the camera 800 to record an image. The display 815 can take on any arbitrary two-dimensional or three-dimensional shape. For example, the display 815 can be a rounded rectangle, a circle, a half round shape, an ellipsoid, a cuboid, etc. The camera 800 can comprise a plurality of smaller noncontiguous cameras (i.e. a plurality of smaller noncontiguous pixel regions) distributed throughout the display 815.

Figure 8B:
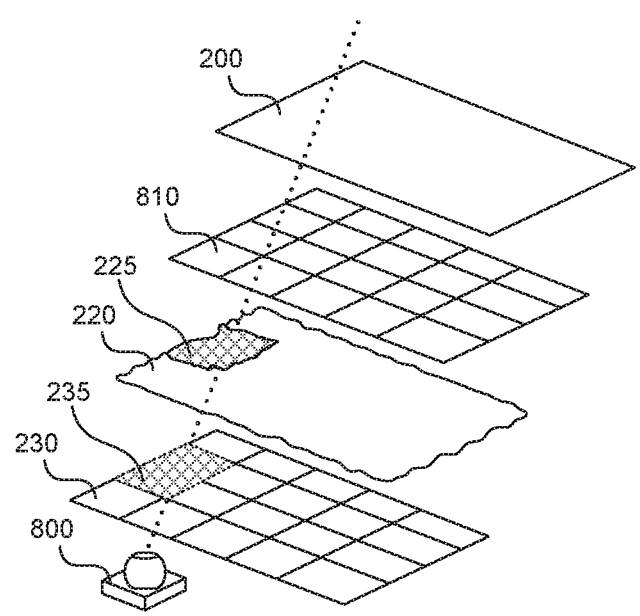
FIG. 8B shows a display including a camera integrated into the display beneath the CF layer, according to one embodiment.

FIG. 8B shows a display 815 including a camera 800 integrated into the display 815 beneath the CF layer 810, according to one embodiment. The display 815 includes a substantially transparent cover layer 200, the color filter layer 810, a display layer 220, and a TFT layer 230. A substantially transparent cover layer 200 defines an outside surface associated with the display 815.

The color filter (CF) layer 810 is disposed beneath the substantially transparent cover layer 200. The CF layer 810 comprises a CF substrate and a plurality of color regions disposed on the CF substrate. The plurality of color regions corresponds to any set of colors capable of reproducing, alone or in combination, substantially the full visible light spectrum. The set of colors can be red, green, and blue (RGB); red, green, blue, and white (RGBW), where white transmits substantially the full electromagnetic spectrum; red, green, blue, and infrared (IR), where the IR region transmits substantially the IR part of the electromagnetic spectrum; cyan, magenta, and yellow (CMYK), etc. An IR sensor can be placed beneath the white color region, or beneath the IR region. An ambient sensor, or a pixel associated with the camera 800 can be placed beneath the white color region.

Layers 200, 220, 230, and the substantially transparent regions 225, 235 are described above. The layers 200, 810, 220, 230 can be configured to be flexible.

The camera 800 is disposed beneath the CF layer 810, and proximate to the display layer 220, and the TFT layer 230. The camera 800 can be placed beneath one or more layers 220, 230, such as beneath all the layers 220, 230, or the camera can be placed next to one or more layers 220, 230.

Figure 8C:
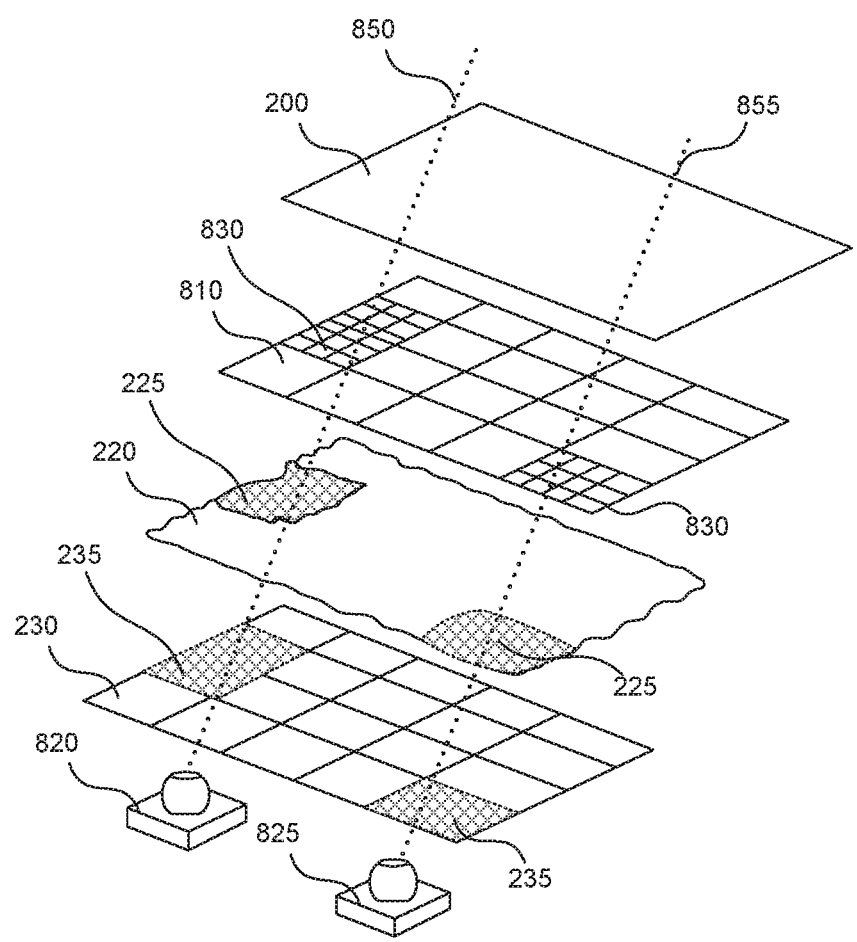
FIG. 8C shows the distribution of color regions associated with the CF layer, according to one embodiment.
Figure 8D:
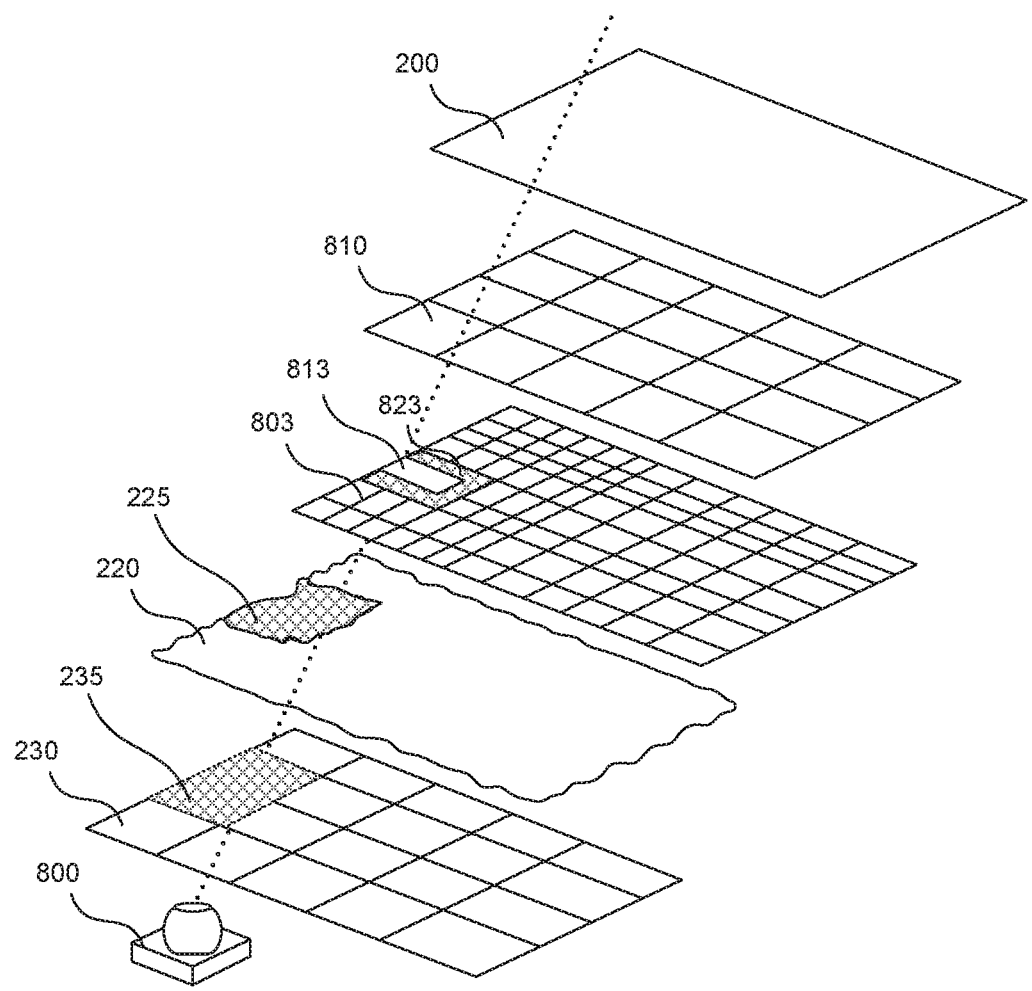
FIG. 8D shows a touch sensor layer 803, according to one embodiment.
Figure 8E:
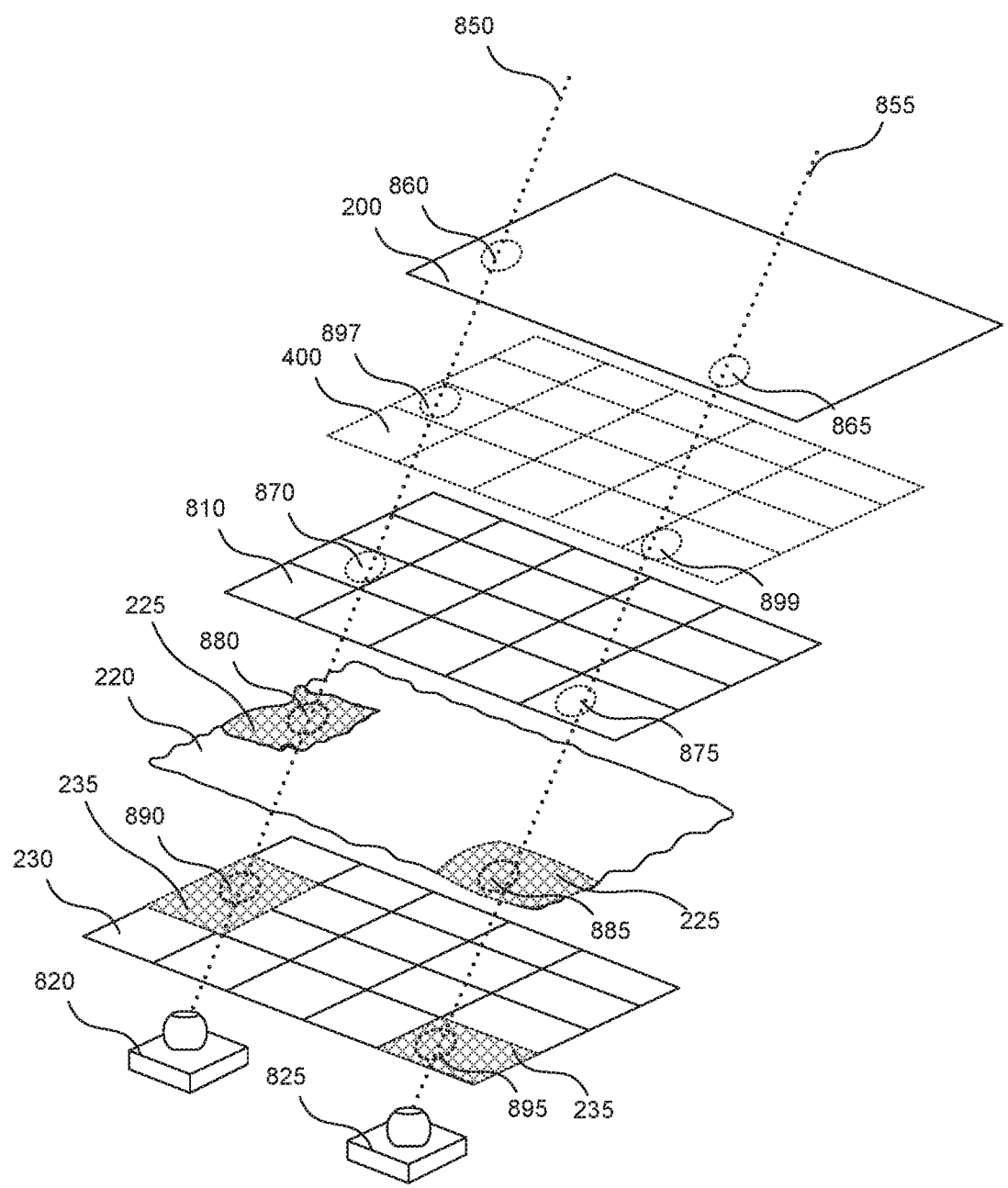
FIG. 8E shows a plurality of lenses corresponding to the plurality of noncontiguous cameras, according to one embodiment.
Figure 8F:
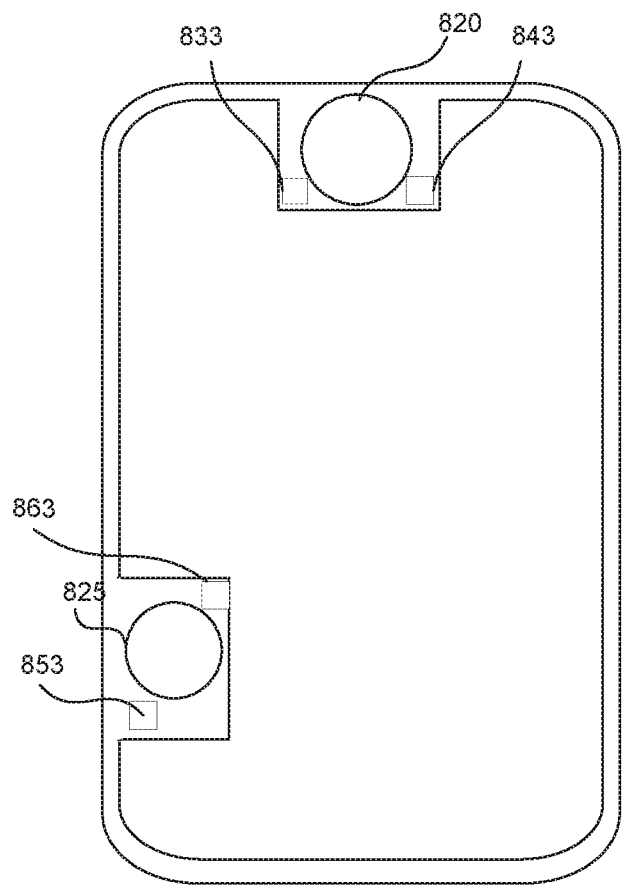
FIG. 8F shows the placement of various sensors proximate to the cameras, according to one embodiment.
Figure 8G:
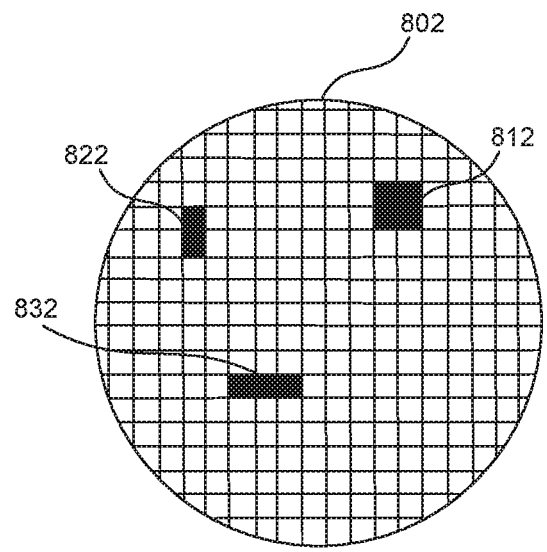
FIG. 8G shows the placement of various sensors dispersed throughout the plurality of pixels associated with the camera, according to one embodiment.
Figure 8H:
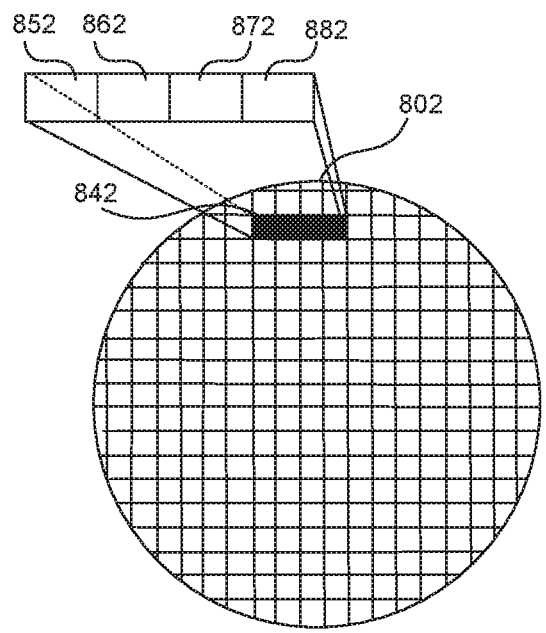
FIG. 8H shows the placement of various sensors and pixels within the plurality of pixels associated with the camera, according to one embodiment.

The camera 800 comprises a plurality of pixels 802 in FIGS. 8G-8H corresponding to the plurality of color regions associated with the CF layer 810, wherein each pixel in the plurality of pixels 802 in FIGS. 8G-8H is optimized to record a colored light beam passing through a color region associated with the CF layer 810. Each pixel in the plurality of pixels 802 in FIGS. 8G-8H comprises a lens and a photodetector, where the lens associated with the pixel is optimized to focus the colored light beam. Lenses that focus the full visible light spectrum suffer from chromatic aberration (i.e. the focal point of blue light is different than the focal point of red light), because, for example, the index of refraction for blue light is larger than the index of refraction for red light. Manufacturing each lens to focus the light beam of a single color reduces the cost of manufacturing, and avoids the problem of chromatic aberration.

Further, the plurality of lenses corresponding to the plurality of pixels 802 in FIGS. 8G-8H can have various effective focal lengths from extremely short focal lengths to extremely long focal lengths, and can focus light coming from different depths away from the camera 800. A processor is configured to gather a plurality of images corresponding to the plurality of pixels 802 in FIGS. 8G-8H, and to produce an image comprising depth information, such as a stereoscopic image, a depth map, etc.

The layers 220, 230 with the substantially transparent regions 225, 235 are arranged and coupled such that the substantially transparent region 225, 235 extends through the display layer 220, and the TFT layer 230, wherein the substantially transparent region 225, 235 faces the camera and exposes the camera 800 to allow the light from the outside environment to reach the camera 800. The shape of the layers 810, 220, 230, and the cover layer 200, can follow the shape of the display 815 and can be any arbitrary two-dimensional or three-dimensional shape, such as a rounded rectangle, a circle, a half round shape, an ellipsoid, a cuboid, etc. The substantially transparent regions 225, 235 are described above. The layers 200, 810, 220, 230 can be configured to be flexible.

FIG. 8C shows the distribution of color regions associated with the CF layer 810, according to one embodiment. Camera 800 can include a plurality of noncontiguous cameras, such as cameras 800, and 825. Noncontiguous cameras 820, and 825 include one or more pixels associated with the camera 800 in FIG. 8A. Regions 225, 235 are noncontiguous substantially transparent regions associated with layers 220, 230 respectively. Noncontiguous cameras 820, 825 receive light beams 850, 855, respectively, through the color regions 830, 840 associated with the CF layer 810. Noncontiguous cameras 820, 825 can be placed beneath the layers 220, 230, or can be placed proximate to the layers 220, 230. For example, if the substantially transparent regions 225, 235 are holes, the noncontiguous cameras 820, 825 can be placed inside the substantially transparent regions 225, 235. In another embodiment, the noncontiguous cameras 820, 825 can be placed on a substrate associated with the layers 220, 230. The color regions 830, 840 associated with the CF layer 810, disposed above the noncontiguous cameras 820, 825, are smaller than a color regions associated with the CF layer 810 and not disposed above the camera 800. In one embodiment, the size of the color regions 830, 840 disposed above the camera 800, correspond to the size of the pixels associated with the noncontiguous cameras 820, 825, while the size of the color regions not disposed above the camera 800 correspond to the size of the display 815 pixels.

FIG. 8D shows a touch sensor layer 803, according to one embodiment. The touch sensor layer 803 comprises touch sensors associated with a standalone layer, or touch sensors associated with any of the layers 200, 810, 220, 230. The touch sensors can be capacitive, or resistive, or any other type of touch sensors.

The touch sensor layer 803 can be a separate layer placed between any of the layers 200, 810, 220, 230. For example, the touch sensor layer 803 can be placed between the cover layer 200 and the CF layer 810, between the CF layer 810 and the display layer 220, etc.

The touch sensor layer 803 can comprise a plurality of noncontiguous touch sensor regions integrated into any of the layers 200, 810, 220, 230. For example, the touch sensors can be dispersed throughout the layers 200, 810, 220, 230. In another embodiment, the touch sensors can be dispersed throughout the pixels associated with the camera 800, as shown in FIGS. 8G-8H. According to one embodiment, touch sensor layer 803 includes a substantially transparent region 813 placed above the substantially transparent regions 225, 235 associated with the layers 220, 230 respectively. The substantially transparent region 813 includes a region 823 comprising touch sensors. The region 823 associated with the touch sensor layer 803, overlaps the substantially transparent regions 225, 235 associated with layers 220, 230 respectively, along the boundary associated with the substantially transparent regions 225, 235. According to another embodiment, the region 823 overlaps the substantially transparent regions 225, 235, and the region 823 is noncontiguous. The region 823 is placed above the camera 800 and includes touch sensors that when activated in turn activate the camera 800 to perform various actions such as to record an image of an object activating the touch sensor, or to activate an application associated with the camera 800.

For example, when the touch sensors disposed above the camera, such as touch sensors in the region 823, are activated and the device 817 is locked, the camera 800 can act as a fingerprint sensor by taking a picture of the object activating the touch sensor. A processor coupled to the camera 800 can compare a recorded picture to an image of a fingerprint authorized to unlock the device 817.

FIG. 8E shows a plurality of lenses corresponding to the plurality of noncontiguous cameras, according to one embodiment. Noncontiguous cameras 820, 825 receive light beams 850, 855 through one or more lenses 860, 865, 870, 875, 880, 885, 890, 895, 897, 899. Each layer 200, 803, 810, 220, 230 can have zero or more lenses 860, 865, 897, 899, 870, 875, 880, 885, 890, 895 corresponding to the noncontiguous cameras 820, 825. The substantially transparent cover layer 200 includes lenses 860, 865 disposed on the substantially transparent cover layer 200. The CF layer lenses 870, 875 are disposed on the CF substrate associated with the CF layer 810. The display layer lenses 880, 885 are disposed on the display substrate associated with the display layer 220. The TFT layer lenses 890, 895 are disposed on the TFT substrate associated with a TFT layer 230. The optional touch sensor layer 803 can include lenses 897, 899 disposed on the touch sensor substrate.

Lenses 860, 865, 870, 875, 880, 885, 890, 895, 897, 899 corresponding to the noncontiguous cameras 820, 825 can have various focal lengths from extremely short focal lengths to extremely long focal lengths, and can focus light coming from different depths away from the camera 800, and noncontiguous cameras 820, 825. Each lens in the plurality of lenses 860, 865, 870, 875, 880, 885, 890, 895, 897, 899 corresponds to one or more pixels associated with the noncontiguous cameras 820, 825. For example, lens 860 can include one or more lenses, where the one or more lenses correspond to one or more pixels associated with the camera 820.

A processor is configured to gather a plurality of images corresponding to the noncontiguous cameras 820, 825, and to produce an image comprising depth information, such as a stereoscopic image, a depth map, etc.

FIG. 8F shows the placement of various sensors 833, 843, 853, 863 proximate to the cameras 820, 825, according to one embodiment. The various sensors 833, 843, 853, 863 can be an ambient light sensor, an infrared (IR) receiver, an IR emitter, or a touch sensor. The IR sensor can be used for proximity sensing, distance sensing, and/or time of flight. The IR sensor can be a light emitting diode (LED), a laser, an LED laser, etc. The various sensors 833, 843, 853, 863 can be placed to overlap the substantially transparent regions 225, 235 associated with layers 220, 230 respectively including being placed over the cameras 820, 825.

FIG. 8G shows the placement of various sensors dispersed throughout the plurality of pixels 802 associated with the camera 800, according to one embodiment. The camera 800 comprises a plurality of pixels 802 disposed on a camera substrate. Instead of pixels, the camera substrate can receive various sensors 812, 822, 832, such as an IR sensor, touch sensor, ambient light sensor, etc.

FIG. 8H shows the placement of various sensors and pixels within the plurality of pixels 802 associated with the camera 800, according to one embodiment. The plurality of pixels 802 comprises a plurality of regions, wherein each region 842 in the plurality of regions includes 4 subregions, 852, 862, 872, 882. Region 842 can have a square shape, a rectangular shape, a slanted line shape as shown in FIG. 12C, etc. According to one embodiment, the plurality of regions tiles the plurality of pixels 802. Each subregion 852, 862, 872, 882 corresponds to either a pixel or a sensor, such as an IR sensor, touch sensor, ambient light sensor, etc. In one embodiment, subregion 852 corresponds to a red pixel, subregions 862, 872 correspond to a green pixel, and subregion 882 corresponds to a blue pixel. In another embodiment, one of the subregions 852, 862, 872, 882 corresponds to white pixel, an IR sensor, a touch sensor, an ambient light sensor, etc.

In another embodiment, the subregions 852, 862, 872, 882 correspond to a single sensor configured to record red, green, blue light; or red, green, blue, white light; or cyan, magenta, yellow light, etc.

Further, each pixel in the plurality of pixels 802 comprises a lens and a photodetector. The plurality of lenses corresponding to the plurality of pixels 802 can have various focal lengths from extremely short focal lengths to extremely long focal lengths, and can focus light coming from different depths away from the camera 800. A processor is configured to gather a plurality of images corresponding to the plurality of pixels 802 in FIGS. 8G-8H, and to produce an image comprising depth information, such as a stereoscopic image, a depth map, etc.

Figure 9:
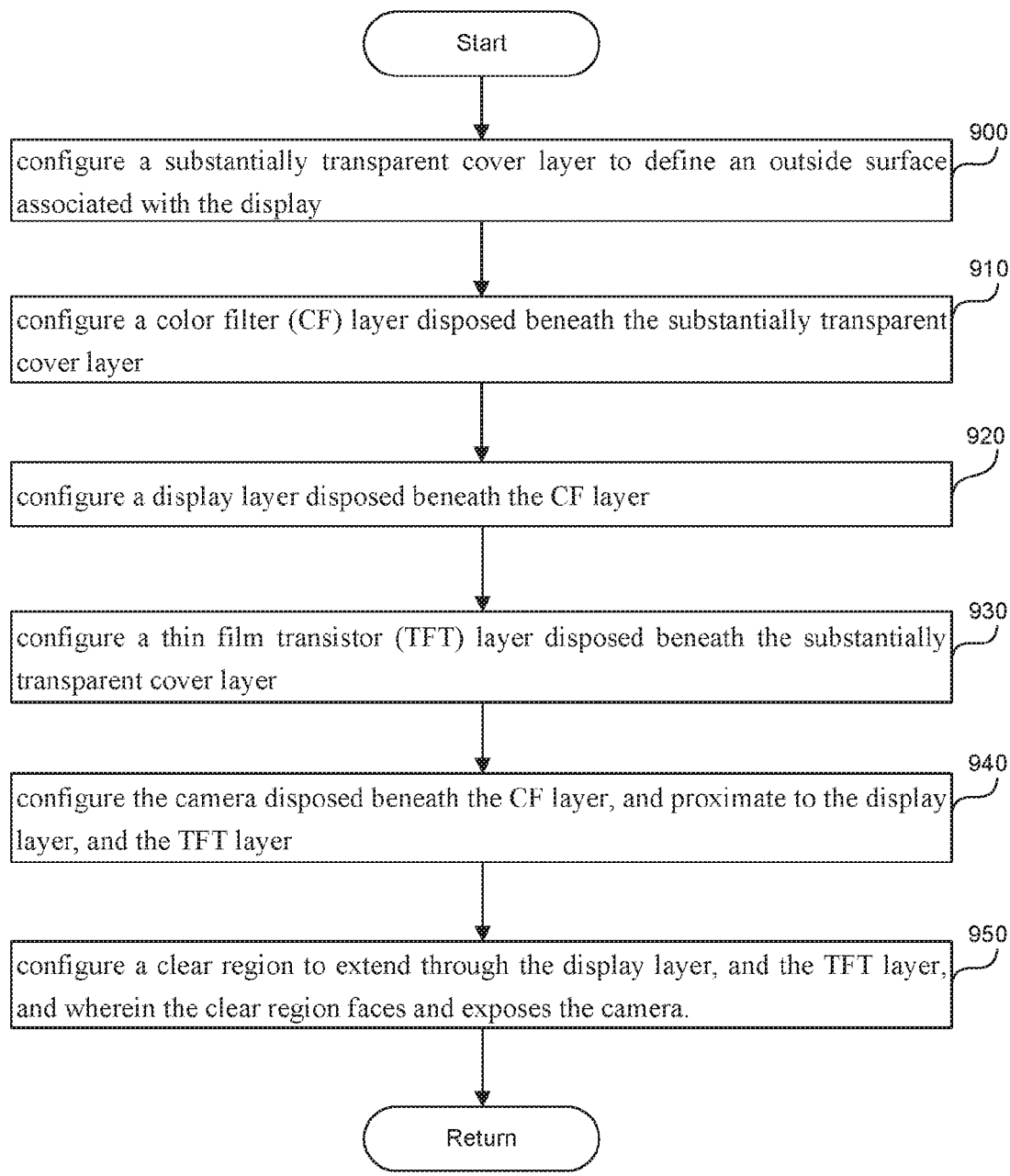
FIG. 9 is a flowchart of a method to integrate a camera into a display, according to one embodiment.

FIG. 9 is a flowchart of a method to integrate a camera into a display, according to one embodiment. In step 900, a substantially transparent cover layer 200 is configured to define an outside surface associated with the display 815.

In step 910, a color filter (CF) layer 810 is disposed beneath the substantially transparent cover layer 200, the CF layer 810 comprising a CF substrate and a plurality of color regions disposed on the CF substrate. Each color region associated with the CF layer 810 and disposed above the camera 800 is smaller than a color region associated with the CF layer 810 and not disposed above the camera 800. The CF layer 810 can include a white color region, where the white color region can transmit substantially the full electromagnetic spectrum; or the CF layer 810 can include an IR region, where the IR region can transmit the infrared part of the electromagnetic spectrum. An IR sensor can be placed beneath the white color region, or the IR color region. An ambient sensor, or a camera pixel can be placed beneath the white color region.

In step 920, a display layer 220 is disposed beneath the CF layer 810, the display layer 220 comprising a display substrate and a plurality of display elements disposed on the display substrate, the plurality of display elements configured to transmit light. The light transmission includes generation of light by the display elements, or allowing the light generated by other layers to pass through the display elements. The display layer 220 can be a liquid crystal display (LCD) layer disposed beneath the CF layer 810, the LCD layer including an LCD substrate and a plurality of liquid crystals disposed on the LCD substrate. The display layer 220 can be an organic light emitting diode (OLED) layer disposed beneath the CF layer 810, the OLED layer comprising an OLED substrate and a plurality of OLEDs disposed on the OLED substrate.

In step 930, a thin film transistor (TFT) layer 230 is disposed beneath the substantially transparent cover layer 200, the TFT layer 230 comprising a TFT substrate and a plurality of TFTs disposed on the TFT substrate.

In step 940, the camera 800 is disposed beneath the CF layer 810, and proximate to the display layer 220, and the TFT layer 230. The camera 800 includes a plurality of pixels 802 corresponding to the plurality of color regions associated with the CF layer 810. Each pixel in the plurality of pixels 802 is optimized to record a colored light beam passing through a color region associated with the CF layer 810. Each pixel in the plurality of pixels includes a lens and a photodetector. The lens associated with the pixel is optimized to focus the colored light beam. The plurality of pixels 802 can be divided into a plurality of noncontiguous regions 820, 825.

In step 950, a substantially transparent region 225, 235 is configured to extend through the display layer 220, and the TFT layer 230, and wherein the substantially transparent region 225, 235 faces and exposes the camera.

Other method steps can be performed to create various embodiments disclosed herein.

Camera Integrated into the Display Beneath the Thin Film Transistor Layer

Figure 10A:
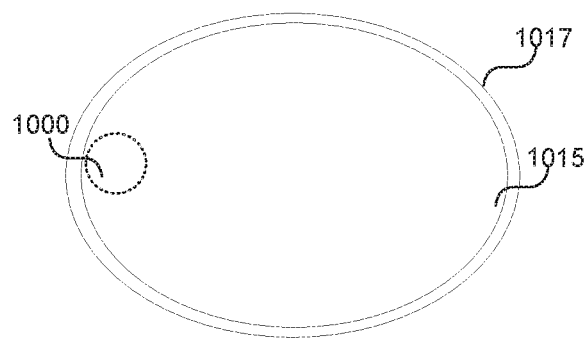
FIG. 10A shows a camera integrated into an oval display, according to one embodiment.

FIG. 10A shows a camera integrated into an oval display, according to one embodiment. A display 1015 associated with a device 1017, such as a mobile device, a stand-alone camera device, a desktop computer, or any kind of device comprising a display, includes a camera 1000. The display 1015 surrounds the camera 1000. The camera 1000 can be placed anywhere on the display 1015, such as along the perimeter of display, in the middle of the display, etc. The display 1015 can include one or more cameras, such as the camera 1000. The portion of the display 1015 nearest to the camera 1000 can be reserved for operating system icons associated with a device, such as the battery icon, etc., or the portion of the display 1015 nearest to the camera 1000 can be used for application icons not associated with the operating system.

The camera 1000 can represent a camera icon associated with the display 1015. When the camera icon is selected, such as by touch selection, the camera icon can be configured to activate the camera 1000 such as by activating an application associated with the camera 1000, or by activating the camera 1000 to record an image. The display 1015 can take on any arbitrary two-dimensional or three-dimensional shape. For example, the display 1015 can be a rounded rectangle, a circle, a half round shape, an ellipsoid, a cuboid, etc. The camera 1000 can comprise a plurality of smaller noncontiguous cameras (i.e. a plurality of smaller noncontiguous pixel regions) distributed throughout the display 1015.

Figure 10B:
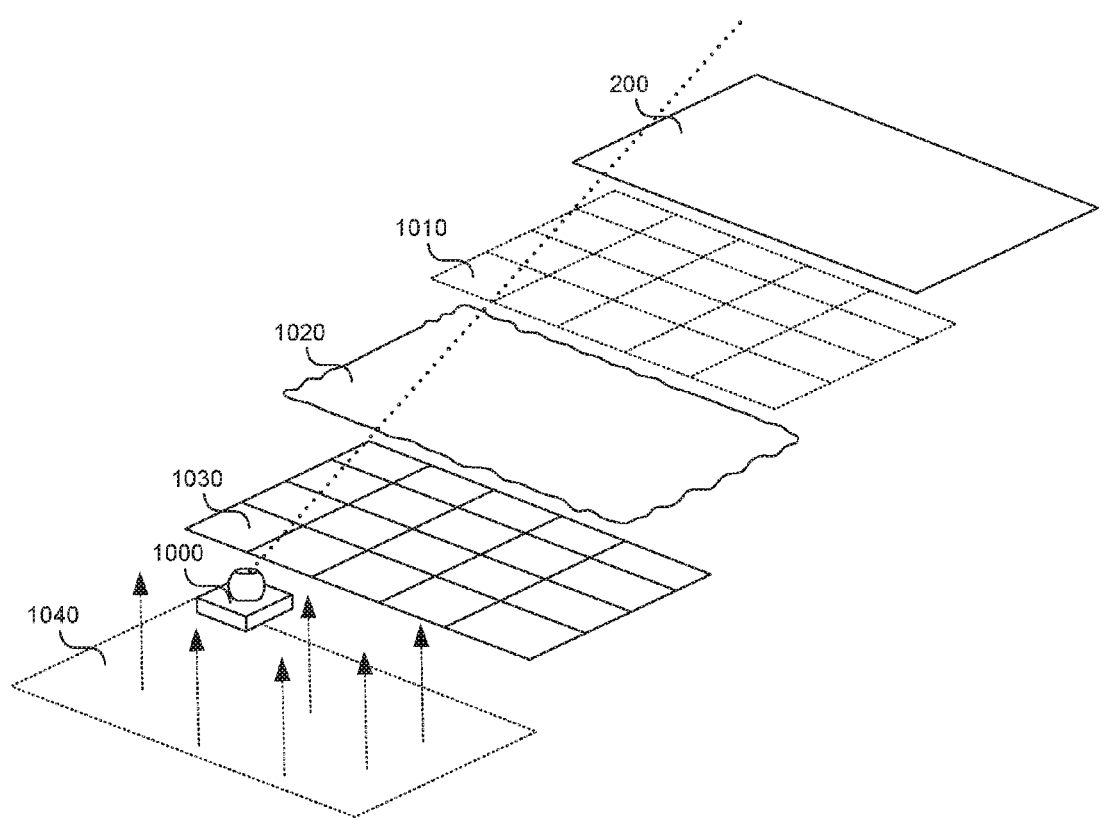
FIG. 10B shows a display including a camera integrated into the display, according to one embodiment.

FIG. 10B shows a display 1015 including a camera 1000 integrated into the display 1015, according to one embodiment. The display 1015 includes a substantially transparent cover layer 200, a camera 1000, the optional color filter layer 1010, a display layer 1020, a TFT layer 1030, and an optional back light layer 1040. The layers 200, 1010, 1020, 1030, 1040 can be configured to be flexible, and/or substantially transparent. The shape of the layers 1010, 1020, 1030, 1040, and the cover layer 200, can follow the shape of the display 1015 and can be any arbitrary two-dimensional or three-dimensional shape, such as a rounded rectangle, a circle, a half round shape, an ellipsoid, a cuboid, etc.

The substantially transparent cover layer 200 defines an outside surface associated with the display 1015. The camera 1000 comprises a plurality of pixels, where the plurality of pixels can be contiguous or noncontiguous.

An optional color filter (CF) layer 1010 is disposed beneath the substantially transparent cover layer 200. The CF layer 1010 includes a CF substrate and a plurality of color regions disposed on the CF substrate. The plurality of color regions corresponds to any set of colors capable of reproducing, alone or in combination, substantially the full visible light spectrum. The set of colors can be red, green, and blue (RGB); red, green, blue, and white (RGBW), where the white region transmits substantially the full electromagnetic spectrum; red, green, blue, and infrared (IR), where the IR region transmits substantially the IR part of the electromagnetic spectrum; cyan, magenta, and yellow (CMYK), etc. An IR sensor can be placed beneath the white color region, or the IR region. An ambient sensor, a touch sensor, or a pixel associated with the camera 1000 can be placed beneath the white color region. A sensor, such as an IR sensor, ambient sensor, or a touch sensor can be integrated into the plurality of pixels associated with the camera 1000, as shown in FIGS. 12B-12C.

A display layer 1020, disposed beneath the cover layer 200, includes a display substrate and a plurality of display elements disposed on the display substrate. The display layer 1020 can be transparent. According to one embodiment, the plurality of display elements are configured to transmit light, and are configured to stop transmitting light when a plurality of pixels associated with the camera 1000 is recording an image. The light transmission includes generation of light by the display elements, or allowing the light generated by other layers to pass through the display elements. Turning off the display elements to expose the plurality of pixels lasts less than a single refresh of the display, so that turning off the display is imperceptible to the user. Typically the refresh rate is 60 Hz, but can also be 120 Hz, 240 Hz, 600 Hz, etc. The plurality of pixels can be exposed multiple times in order to record a single image, where each exposure lasts less than 1/60 of a second.

In another embodiment, the plurality of pixels is exposed while the display elements are still on. The processor coupled to the camera 1000 stores a display image shown on the mobile device display screen while the plurality of pixels are being exposed. When the plurality of pixels records the image, the processor receives the image, and corrects the received image based on the stored display image, to remove the color bleeding from the mobile device display into the image recorded by the plurality of pixels.

The display layer 1020 can be a liquid crystal display (LCD) layer including an LCD substrate and a plurality of liquid crystals disposed on the LCD substrate. The plurality of liquid crystals are configured to assume a first arrangement and a second arrangement based on being activated by thin film transistors. The first arrangement transmits light, and the second arrangement blocks light. Also, the display layer 1020 can be an organic light emitting diode (OLED) layer including an OLED substrate and a plurality of OLEDs disposed on the OLED substrate. An OLED in the plurality of OLEDs emits lights when activated by a thin film transistor, and stops emitting light when not activated by the thin film transistor.

A thin film transistor (TFT) layer 1030 disposed beneath the display layer 1020, includes a TFT substrate and a plurality of thin film transistors disposed on the TFT substrate. The TFT layer 1030 can be transparent. The thin film transistors control the position of a liquid crystal in the plurality of liquid crystals causing the liquid crystal to act as a shutter blocking light, or transmitting light. The thin film transistors also control whether an OLED in the plurality of OLEDs emits light, or does not emit light.

The camera 1000 is disposed beneath the CF layer 1010, the display layer 1020, and the TFT layer 1030. The camera 1000 includes the plurality of pixels corresponding to the plurality of color regions associated with the CF layer 1010. Each pixel in the plurality of pixels comprises a lens and a photodetector. The lens associated with the pixel is optimized to focus the colored light beam passing through a color region in the plurality of color regions associated with the CF layer 1010. Lenses that focus the full visible light spectrum suffer from chromatic aberration (i.e. the focal point of blue light is different than the focal point of red light), because, for example, the index of refraction for blue light is larger than the index of refraction for red light. Manufacturing each lens to focus the light beam of a single color reduces the cost of manufacturing, and avoids the problem of chromatic aberration.

Further, the plurality of lenses corresponding to the plurality of pixels can have various effective focal lengths from extremely short focal lengths to extremely long focal lengths, and can focus light coming from different depths away from the camera 1000. A processor is configured to gather a plurality of images corresponding to the plurality of pixels, and to produce an image comprising depth information, such as a stereoscopic image, a depth map, etc.

The optional back light layer 1040 is configured to emit light, such as light emitted by light emitting diodes. The optional back light layer 1040 is configured to turn off and the plurality of liquid crystals configured to assume the arrangements to transmit light, when the plurality of pixels are recording an image. When the optional back light layer 1040 turns off, the display layer 1020 does not emit light. However, because the liquid crystals are arranged to transmit light, the light from the outside can get through the layers 1010, 1020, 1030, including a display layer 1020, and reach the camera 1000. When the optional back light layer 1040 is not present, the light is emitted by the OLEDs associated with the display layer 1020. The OLEDs are configured to turn off, when the plurality of pixels are recording an image. Because the OLEDs, as well as the rest of the layers, 1010, 1020, 1030, can be substantially transparent, the light from the outside can reach the camera 1000.

According to one embodiment, thin film transistors act as camera shutters, controlling the exposure of the plurality of pixels disposed beneath the TFT layer. In various embodiments described herein, thin film transistors can act in unison, or thin film transistors can be turned on or off independently from each other. A thin film transistor can control the exposure of an individual pixel in the plurality of pixels. The thin film transistor can completely block one pixel from receiving light, can allow the one pixel to partially receive light, or can allow the one pixel to fully receive light.

For example, if a photodetector associated the one pixel is receiving high intensity light close to the saturation limit of the photodetector, such as the one pixel is directly pointed to the sun, the thin film transistor can reduce the amount of the pixel exposure by blocking the passage of light. In other words, when the photodetector is within 70% of the saturation limit, the thin film transistor blocks the passage of light by causing the display element to assume the second position which blocks the passage of light. The thin film transistor can block the passage of light for the remainder of the exposure, or intermittently during the remainder of the exposure. Specifically, while the plurality of pixels is being exposed, the display element can remain in the second position for the remainder of the exposure, or the thin film transistor can toggle between the first position and the second position, thus causing the one pixel to record dimmer light.

In another example, thin film transistors can selectively block light or transmit light to pixels that are sensitive to a specific part of the electromagnetic spectrum, such as the red part of the spectrum, the blue part of the spectrum, the infrared part of the spectrum, the ultraviolet part of the spectrum, etc. By allowing light to pass only to the infrared sensitive pixels, thin film transistors cause the camera to take an infrared picture of the scene. In addition, by allowing light to pass only to the green and red sensitive pixels, thin film transistors cause the camera to exclude blue light from the scene. A person of ordinary skill in the art will recognize that other combinations of the electromagnetic spectrum frequencies are possible.

Figure 11:
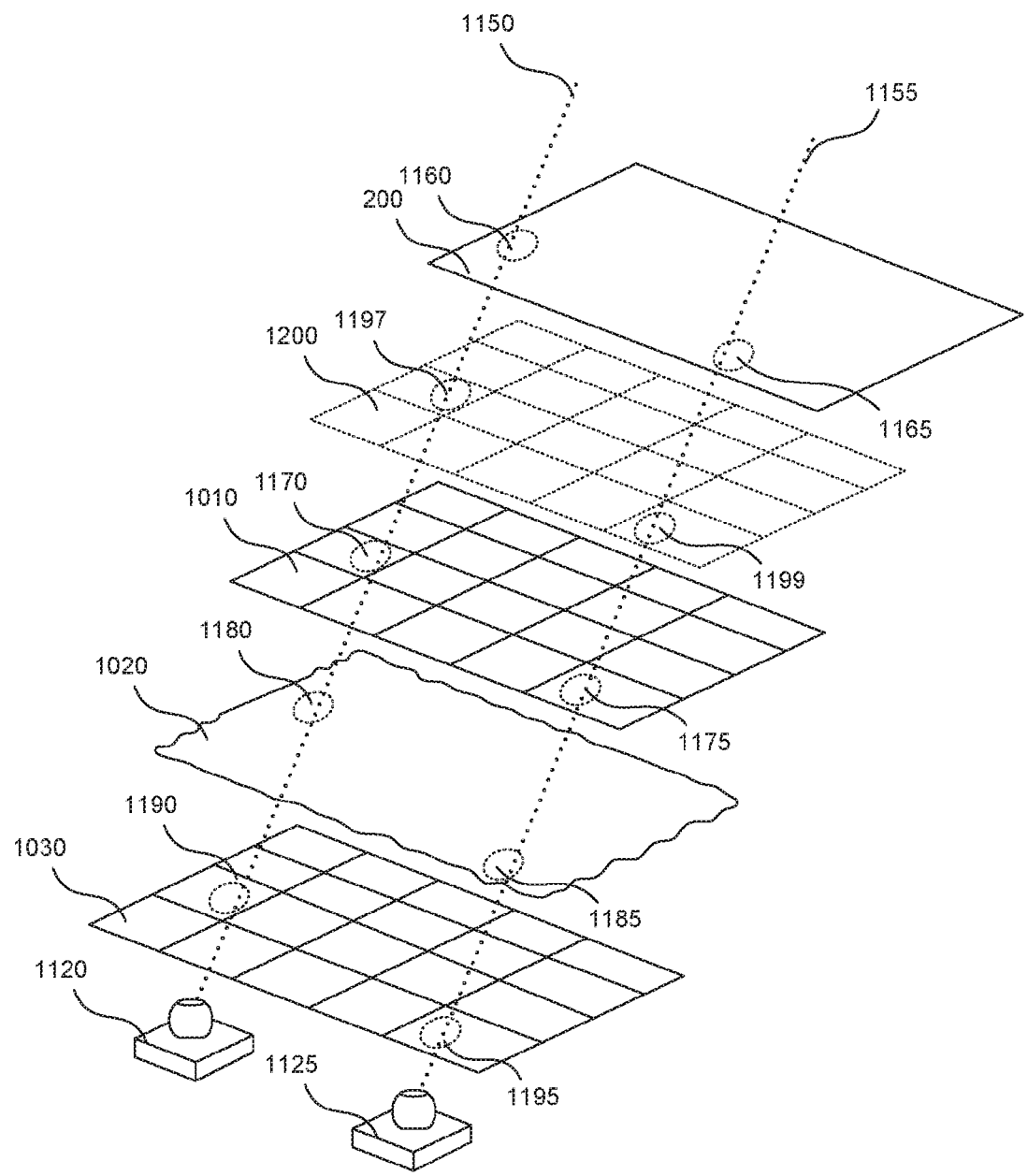
FIG. 11 shows a plurality of lenses corresponding to the plurality of camera pixels, according to one embodiment.

FIG. 11 shows a plurality of lenses corresponding to the plurality of camera pixels, according to one embodiment. Camera 1000 can include a plurality of noncontiguous cameras, such as cameras 1120, 1125. Noncontiguous cameras 1120, 1125 include one or more pixels in the plurality of camera pixels, and are an example of noncontiguous pixel regions associated with the camera 1000. Noncontiguous cameras 1120, 1125 receive light beams 1150, 1155 through one or more lenses 1160, 1165, 1170, 1175, 1180, 1185, 1190, 1195, 1197, 1199. Each layer 200, 1010, 1020, 1030, 1200 can have zero or more lenses 1160, 1165, 1170, 1175, 1180, 1185, 1190, 1195, 1197, 1199 corresponding to the noncontiguous cameras 1120, 1125. The substantially transparent cover layer 200 includes lenses 1160, 1165 disposed on the substantially transparent cover layer 200. The CF layer lenses 1170, 1175 are disposed on the CF substrate associated with the CF layer 1010. The display layer lenses 1180, 1185 are disposed on the display substrate associated with the display layer 1020. The TFT layer lenses 1190, 1195 are disposed on the TFT substrate associated with a TFT layer 1030. The optional touch sensor layer 1200, described herein, can include one or more lenses 1197, 1199.

Lenses 1160, 1165, 1170, 1175, 1180, 1185, 1190, 1195, 1197, 1199 corresponding to the noncontiguous cameras 1120, 1125 can have various focal lengths from extremely short focal lengths to extremely long focal lengths, and can focus light coming from different depths away from the camera 1000 in FIG. 10, and noncontiguous cameras 1120, 1125. Each lens in the plurality of lenses 1160, 1165, 1170, 1175, 1180, 1185, 1190, 1195, 1197, 1199 corresponds to one or more pixels associated with the noncontiguous cameras 1120, 1125. For example, lens 1160 can include one or more lenses, where the one or more lenses correspond to one or more pixels associated with the camera 1120.

A processor is configured to gather a plurality of images corresponding to the noncontiguous cameras 1120, 1125, and to produce an image comprising depth information, such as a stereoscopic image, a depth map, etc.

Figure 12A:
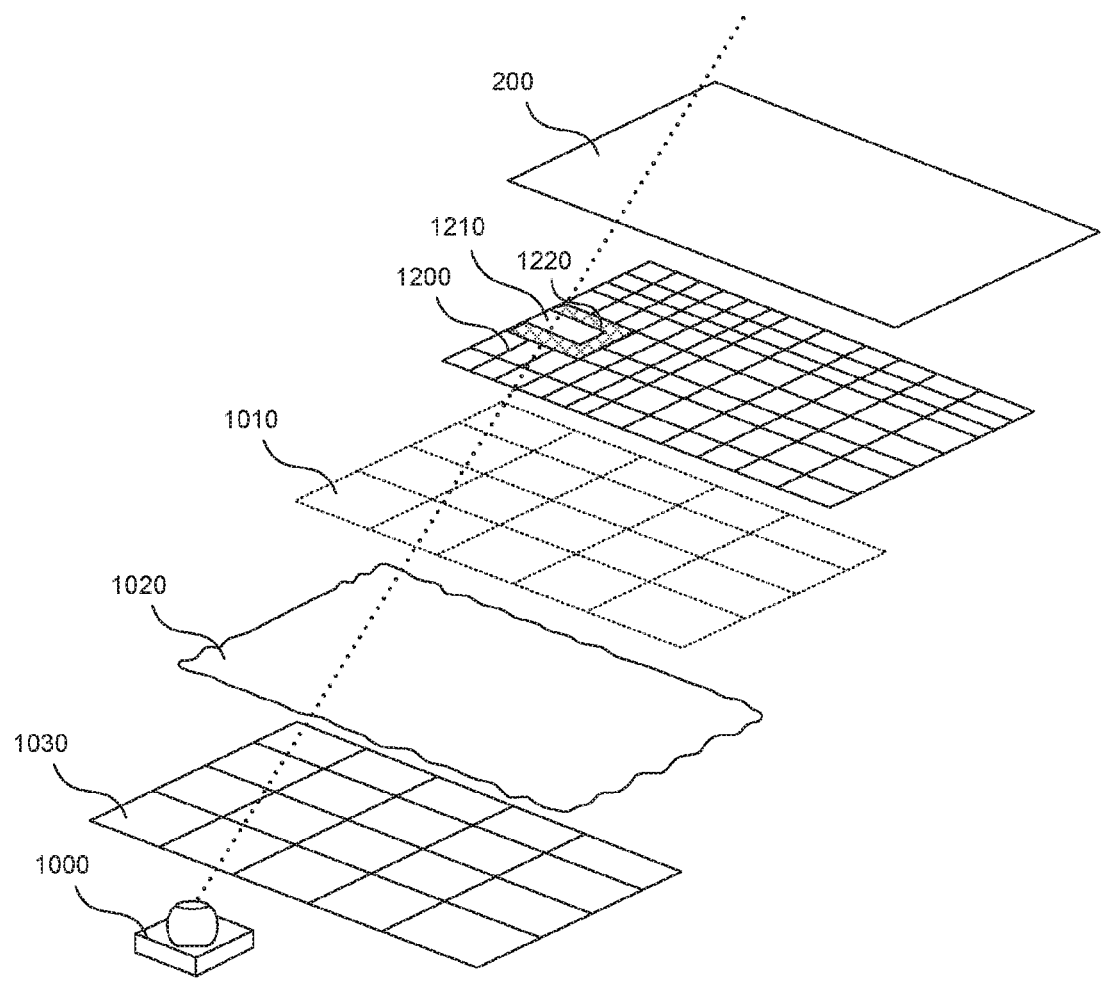
FIG. 12A shows a touch sensor layer 1200, according to one embodiment.
Figure 12B:
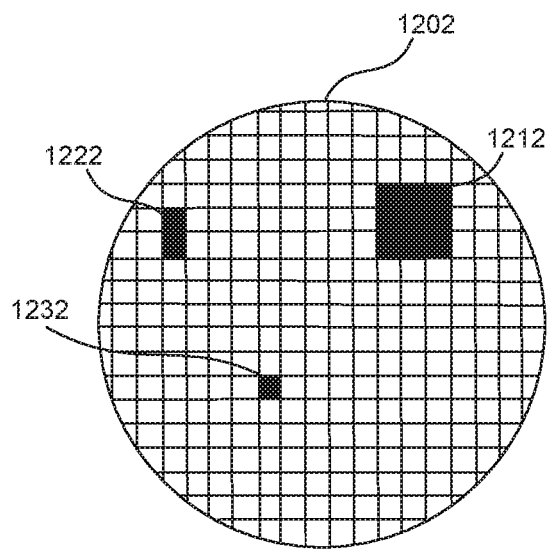
FIG. 12B shows the placement of various sensors dispersed throughout the plurality of pixels associated with the camera, according to one embodiment.
Figure 12C:
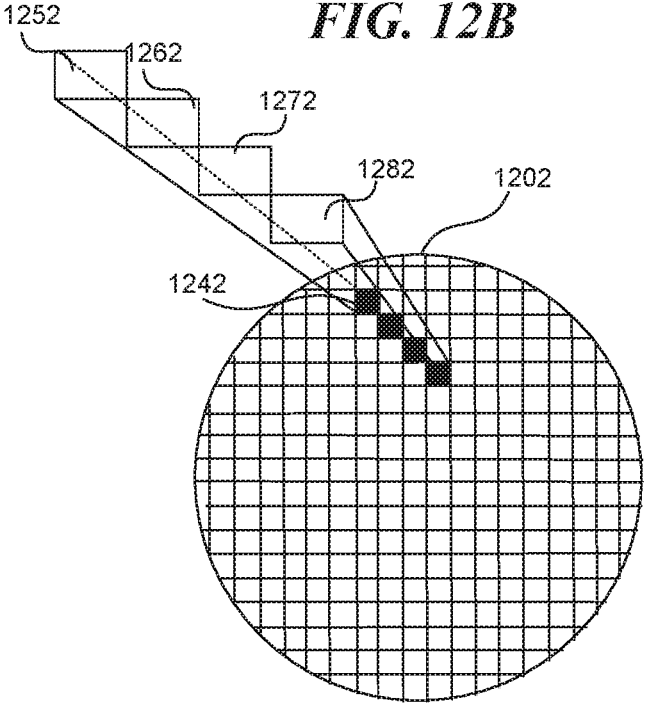
FIG. 12C shows the placement of various sensors and pixels within the plurality of pixels associated with the camera, according to one embodiment.

FIG. 12A shows a touch sensor layer 1200, according to one embodiment. The touch sensor layer 1200 comprises touch sensors associated with a standalone layer, or touch sensors associated with any of the layers 200, 1010, 1020, 1030. The touch sensors can be capacitive, or resistive, or any other type of touch sensors.

The touch sensor layer 1200 can be a separate layer, as shown in FIG. 12A, and can be placed between any of the layers 200, 1010, 1020, 1030. For example, as shown in FIG. 12A, the touch sensor layer 1200 can be placed between the substantially transparent cover layer 200, and the optional CF layer 1010.

The touch sensor layer 1200 can comprise a plurality of noncontiguous touch sensor regions integrated into any of the layers 200, 1010, 1020, 1030. For example, the touch sensors can be dispersed throughout the layers 200, 1010, 1020, 1030. In another embodiment, the touch sensors can be dispersed throughout the pixels associated with the camera 1000, as shown in FIGS. 12B-12C. According to one embodiment, touch sensor layer 1200 includes a substantially transparent region 1210 placed above the camera 1000. The substantially transparent region 1220 includes a region 1210 comprising touch sensors. The region 1220 associated with the touch sensor layer 1200, overlaps the camera 1000, along the boundary associated with the camera 1000. According to another embodiment, the region 1220 overlaps the camera 1000, and the region 1220 is noncontiguous. According to one embodiment, region 1210 associated with the touch sensor layer 1200 is placed above the camera 1000. When the touch sensors associated with the region 1220 are activated, they in turn activate the camera 1000. Camera 1000, when activated, can perform various actions such as to record an image of an object activating the touch sensor, or to activate an application associated with the camera 1000.

For example, when the touch sensors disposed above the camera, such as touch sensors in the region 1210, are activated and the device 1017 is locked, the camera 1000 can act as a fingerprint sensor by taking a picture of the object activating the touch sensor. A processor coupled to the camera 1000 can compare the recorded picture to an image of a fingerprint authorized to unlock the device 1017.

By selectively allowing the light to pass to the plurality of pixels, the thin film transistors can activate only the pixels associated with the activated touch sensors. The resulting image of the object activating the touch sensors is smaller than if all the pixels recorded an image, yet contains the same amount of information. The smaller image saves memory and processing time without sacrificing fingerprint authentication accuracy.

FIG. 12B shows the placement of various sensors dispersed throughout the plurality of pixels 1202 associated with the camera 1000, according to one embodiment. The camera 1000 comprises a plurality of pixels 1202 disposed on a camera substrate. Instead of pixels, the camera substrate can receive various sensors 1212, 1222, 1232, such as an IR sensor, touch sensor, ambient light sensor, etc.

FIG. 12C shows the placement of various sensors and pixels within the plurality of pixels 1202 associated with the camera 1000, according to one embodiment. The plurality of pixels 1202 comprises a plurality of regions, wherein each region 1242 in the plurality of regions includes 4 subregions, 1252, 1262, 1272, 1282. Region 1242 can have a square shape, a rectangular shape, a slanted line shape as shown in FIG. 12C, etc. According to one embodiment, the plurality of regions tiles the plurality of pixels 1202. Each subregion 1252, 1262, 1272, 1282 corresponds to either a pixel or a sensor, such as an IR sensor, touch sensor, ambient light sensor, etc. In one embodiment, subregion 1252 corresponds to a red pixel, subregions 1262, 1272 correspond to a green pixel, and subregion 1282 corresponds to a blue pixel. In another embodiment, one of the subregions 1252, 1262, 1272, 1282 corresponds to a white pixel, an IR sensor, a touch sensor, an ambient light sensor, etc.

In another embodiment, the subregions 1252, 1262, 1272, 1282 correspond to a single sensor configured to record red light, green light, and blue light; or red light, green light, blue light, and white light; or cyan light, magenta light, and yellow light, etc.

Further, each pixel in the plurality of pixels 1202 comprises a lens and a photodetector. The plurality of lenses corresponding to the plurality of pixels 1202 can have various focal lengths from extremely short focal lengths to extremely long focal lengths, and can focus light coming from different depths away from the camera 1000. A processor is configured to gather a plurality of images corresponding to the plurality of pixels 1202 in FIGS. 12B-12C, and to produce an image comprising depth information, such as a stereoscopic image, a depth map, etc.

Figure 13:
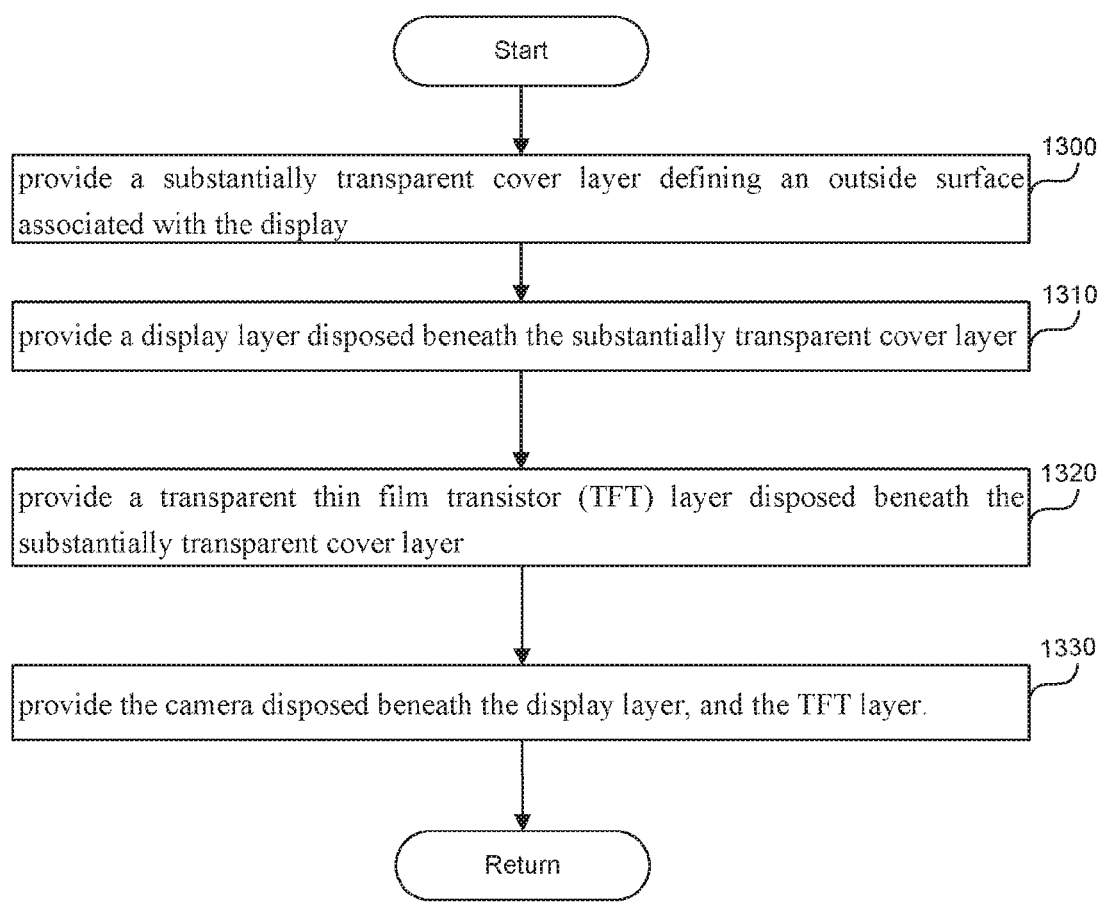
FIG. 13 is a flowchart of a method to integrate a camera into a display, according to one embodiment.
Figure 14:
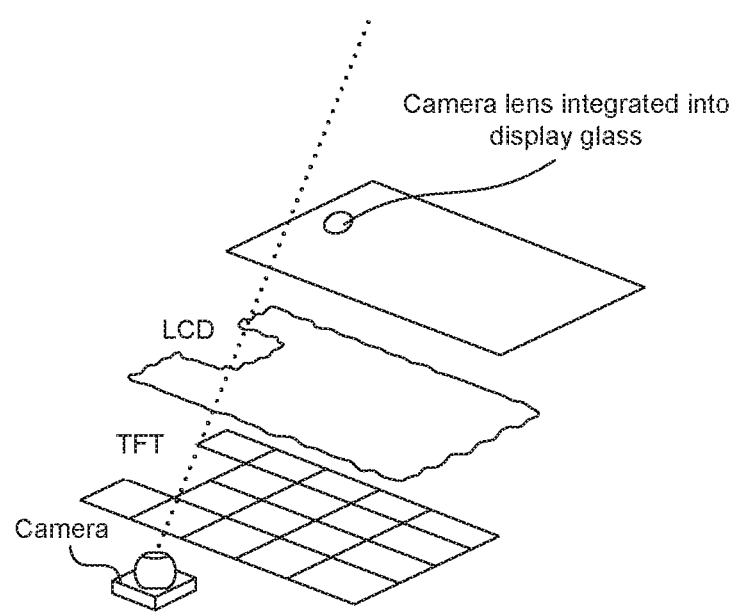
FIG. 14 shows the placement of the camera associated with the mobile device, according to another embodiment.

FIG. 13 is a flowchart of a method to integrate a camera into a display, according to one embodiment. In step 1300, a substantially transparent cover layer 200 is provided defining an outside surface associated with the display 1015. In step 1310, a display layer 1020 is provided and disposed beneath the substantially transparent cover layer 200. The display layer 1020 includes a display substrate and a plurality of display elements disposed on the display substrate, where the plurality of display elements is configured to transmit light. The light transmission includes generation of light by the display elements, or allowing the light generated by other layers to pass through the display elements.

In step 1320, a transparent thin film transistor (TFT) layer 1030 is provided and disposed beneath the substantially transparent cover layer 200. The TFT layer 1030 includes a TFT substrate and a plurality of TFTs disposed on the TFT substrate.

In step 1330, the camera 1000 is provided and disposed beneath the display layer 1020, and the TFT layer 1030. The camera 1000 includes a plurality of pixels. The plurality of pixels can be disposed in a plurality of noncontiguous regions.

Other method steps can be performed to create various embodiments disclosed herein.

Figure 15:
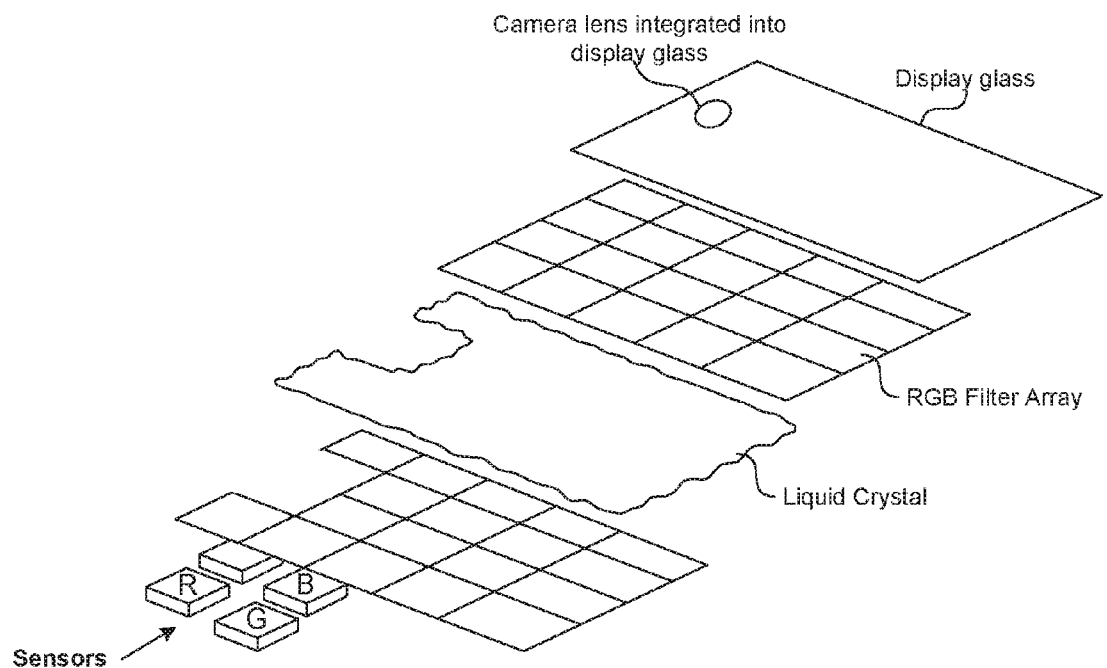
FIG. 15 shows the placement of the camera associated with the mobile device, according to another embodiment.

FIG. 15 shows the placement of the camera associated with the mobile device, according to another embodiment. In one embodiment, the camera is placed underneath the display glass and the color filter layer.

A typical camera includes a color filter. In a typical LCD, there is a glass layer, a color filter layer including an array of pixels Rs, Gs, and Bs, a liquid crystal layer, and a TFT layer in the back. Inside an LCD there are only black and white shutters. Color display is obtained by using a color filter, such as an RGB filter, or other color combination filter. Similarly, the camera also comprises a color filter to record various colors, such as RGB colors.

The technology used for the color filters on LCDs and color filters on cameras is a dye material which absorbs certain wavelengths of the light and then only allows a partial band of the wavelengths to transmit through. In a conventional image sensor the color filter is under the micro lens.

In the embodiment of FIG. 15, the liquid layer and the TFT layer are not blocking the optical path of the camera, so that the camera can have a clear optic path to the color filter. When the camera is placed behind the display color filter, the camera color filter can be excluded. Each camera pixel color corresponds to the color of the display color filter. For example, each camera pixel is optimized to record only red, only green, or only blue, depending on the color of the CF pixel behind which the camera pixel is placed. The color filter in the display can have any number of colors associated with it, as shown in A-F in FIG. 15. Filter D in FIG. 15 has considerably more coarse resolution than the other filters. To solve the resolution problem, according to one embodiment, the color filter in the LCD display comprises a higher density filter than a standard color filter.

In one embodiment, a display pixel includes the RGGB filter, so essentially a quarter of the pixel is red, a quarter of the pixel is blue, and half of the pixel is green. In the current technology, the RGGB filter in the display removes the need for the RGGB filter in the camera. Thus, one camera takes a picture of only one color. An advantage of having one camera take a picture of only one color is that when a lens is designed to work with a sensor, it is much easier to design a lens to work with a single wavelength versus to design a lens to work entirely within the visible band. For example, the lens is designed to work within the red part of the visible spectrum. Additionally, the size of the camera sensor and the size of the lens can be reduced because a smaller sensor can be used to achieve a similar performance of the camera.

For example, five plastic lens elements are needed to actually construct the lens to work with the RGGB sensor. Approximately three plastic lens elements are needed to build a lens for just the red camera. The same advantage is derived from creating the green and the blue sensor as well. This is another way to reduce the cost and also the size of the camera.

A person of ordinary skill in the art will recognize that there are other implementations. The camera so produced can be a stand-alone camera, or can be integrated with another electronic device such as a mobile device.

According to one embodiment, there is a plurality of tiny cameras behind the LCD panel. The cameras are positioned to be far away from each other to get the best information. Various cameras in the plurality of tiny cameras have different focusing distance, such as focus at one meter, two meters, three meters, etc. Using the various images from the various cameras, an image and/or a video can be constructed, in software or hardware, containing depth and an parallax information.

The larger the number of tiny cameras, and the larger the distance between the cameras, the more depth information can be gathered. Even if two cameras are close to each other, for example several pixel apart, some distance information can be gathered especially for close distances. According to one embodiment, the plurality of cameras can function as a proximity sensor.

According to one embodiment, an IR (infrared) emitter and an IR receiver can be integrated into the camera sensors. The IR emitter and the IR receiver can be used as a proximity sensor. According to another embodiment an IR emitter, and an IR receiver can replace one of the cameras in the plurality of tiny cameras behind the LCD panel.

Figure 16:
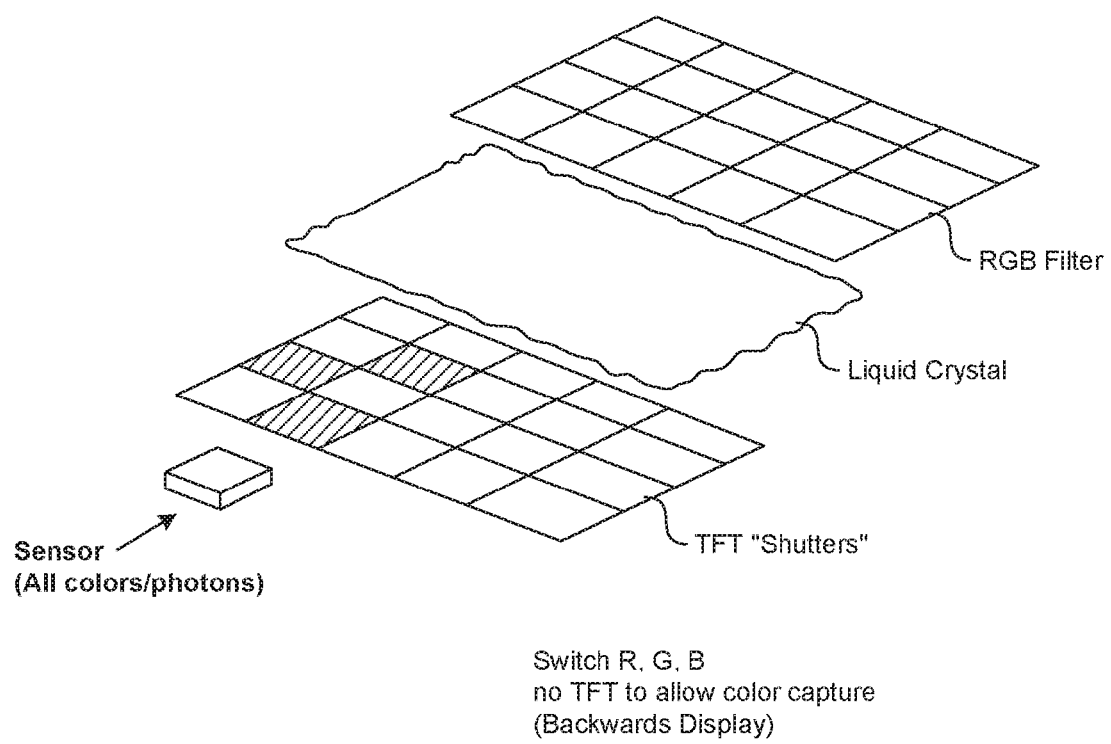
FIG. 16 shows the placement of the camera associated with the mobile device, according to another embodiment.

FIG. 16 shows the placement of the camera associated with the mobile device, according to another embodiment. The camera is covered by a TFT layer, liquid crystal layer, and a color filter layer such as an RGB color filter.

The LCD glass is a part of the active optics of the camera, such as a front-facing camera. In various embodiments described here, the cover glass includes a lens on top of the camera, where the lens acts as the camera lens.

The shutters of the LCD are used to let the light pass through the color filter, such as an RGB filter, and to the camera. The camera takes three images, such as red, green, and blue images. The three images are offset from each other by one pixel. A processor takes the three images as input, shifts them by one pixel, as needed to line up the images, and creates a single RGB image.

In another embodiment, the color filter can include an RGBW filter, where W is a white filter. A tiny camera corresponding to the W filter, records the full spectrum of the visible light. The reason RGBW filter exists for LCDs is because the brightest white that can be obtained by mixing red, green and blue, still filters out a high percentage of the light. However, if some percentage of the pixels have no color filter, the backlight can produce very bright light.

In another embodiment in the RGBW filter, the W filter can let infrared (IR) light through, or light of any other wavelength. An IR emitter and/or an IR receiver can then be placed under the color filter.

The various cameras disclosed here can be stand-alone cameras, or can be integrated into any kind of consumer device, such as a mobile device.

According to another embodiment, the camera can be placed behind an OLED screen, such as a transparent OLED screen. The camera can comprise colored pixels, such as an RGB and a white pixel, or colored pixels and an IR pixel.

Figure 17:
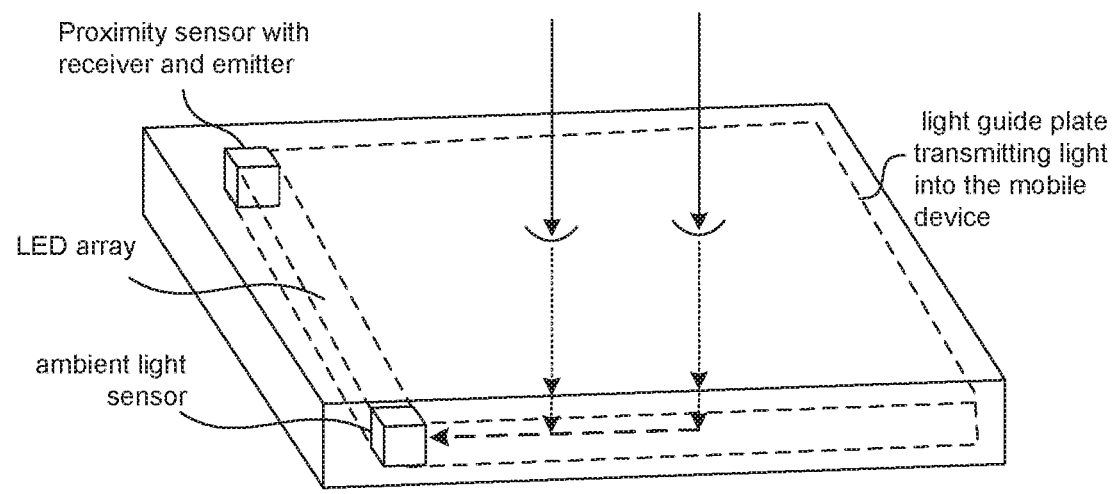
FIG. 17 shows the placement of ambient light, and proximity sensors, according to one embodiment.

FIG. 17 shows the placement of ambient light, and proximity sensors, according to one embodiment. Backlight can be used as a receptor for ambient light and/or proximity sensors. The backlight can also transmit incident light.

Traditionally, the backlight light guide plate defuses the light from an LED array to illuminate the monitor. In the technology disclosed here, the incident light received from the external environment is transmitted by the light guide plate to the sensors placed in the LED array, such as IR sensors, ambient light sensors, fingerprint sensors, etc. Other sensors can detect various bands of the electromagnetic spectrum. Not many receptors would be needed in the LED array.

To detect the ambient light, or incoming IR light, all the extra lighting from the LED can be shut off for a period of time imperceptible to a human observer (e.g., for several microseconds). To let the incident light come through the display and into the backlight guide plate, in the color filter layer, there are a couple of white pixels allowing the light to pass to the back light guide plate.

Light emission from display elements can interfere with image capture in a camera integrated display. For example, light emission from display elements may produce glare or otherwise obstruct image capture. A processor can be electrically connected to the TFT layer and manipulate one or more thin-film transistors to cause display elements to turn off and on. For example, the processor can cause an electric charge of the one or more thin-film transistors to rapidly change from a first state (e.g., 1 causing an "on" state) to a second state (e.g., 0 causing an "off" state) and back to a first state (e.g., 1 again). Causing the electric charge of the thin-film transistors to rapidly change from one state to another and back again can be used to turn a display off (or any portion of a display off) for such a short period of time that a viewer cannot perceive that the display (or any portion thereof) is turned off. For example, the display can be turned off for $1/60$th of a second. While light emission from the display is turned off, a camera positioned in the display can capture an image unobstructed by light from the display. Capturing an image while light is not emitted from the display can enhance a quality of image captured from a camera integrated into a display.

Figure 18:
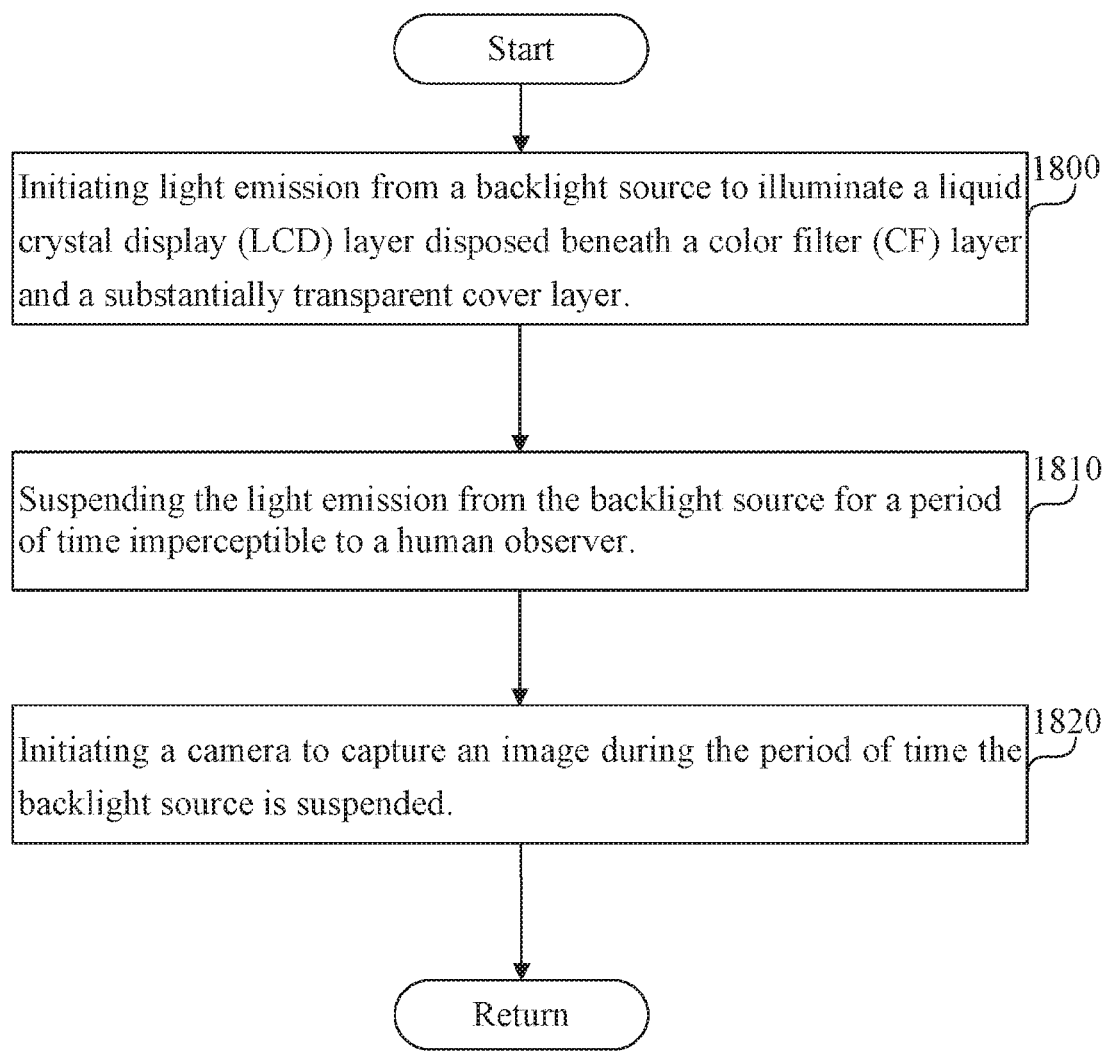
FIG. 18 is a flowchart of a method to modulate a backlight, according to one embodiment.

FIG. 18 is a flowchart of a method to modulate a backlight, according to one embodiment. The method can include initiating light emission from a display disposed beneath a substantially transparent cover layer (step 1800), suspending the light emission from the display for a period of time imperceptible to a human observer (step 1810), and initiating a camera to capture an image during the period of time the backlight source is suspended (step 1820).

Step 1800 involves initiating light emission from a display layer disposed beneath a substantially transparent cover layer. The display layer can be disposed beneath a color filter (CF) layer as described above with respect to FIGS. 8A-8B. The display layer can include, for example, an LCD layer, LED layer (e.g., OLED or QLED), or a combination thereof.

In an embodiment, the display layer includes an LCD display layer. The LCD layer comprises an LCD substrate and a plurality of liquid crystals disposed on the LCD substrate. The plurality of liquid crystals is configured to assume a first arrangement and a second arrangement. The light emitted from the backlight source is transmitted through the first arrangement and blocked by the second arrangement.

In an embodiment, the display layer includes an organic light emitting diode (OLED) layer. The OLED layer can be disposed beneath the CF layer. The OLED layer includes an OLED substrate and a plurality of OLEDs disposed on the OLED substrate.

In an embodiment, the display layer includes a quantum-dot-based light emitting diode (QLED) layer. The QLED layer can be disposed beneath the CF layer. The QLED layer includes a QLED substrate and a plurality of QLEDs disposed on the QLED substrate.

Step 1810 involves suspending the light emission from the display for a period of time imperceptible to a human observer. Light emission can be temporarily suspended to improve a quality of image(s) captured by a camera integrated in the display. The light emission can be suspended for a short period of time (e.g., $1/60$ of a second) to reduce or eliminate perceptibility of the suspension of light by a human observer. A human observer may not be able to perceive with natural senses alone suspension of light from the display for a time period under $1/60$ of a second. Embodiments include time periods less than $1/60$ of a second including, for example, a period of time ranging from approximately 1 microsecond to approximately 1/60th of a second and ranges therebetween.

A processor can be electrically connected to a thin-film transistor layer. One or more display elements (e.g., a single LED or group of LEDs) can be controlled by a thin-film transistor. One or more thin-film transistors can be manipulated to cause display elements to quickly turn off and on again when a camera is engaged (e.g., camera icon selected by a user). Causing the thin-film transistor(s) to suspend light emission for display element(s) can be in response to a camera selection by a user. For example, a user can select a camera icon associated with capturing a phone and in response to the selection, the processor can cause the thin-film transistor(s) to suspend light emission from the display element(s). In an embodiment, the display elements that are suspended can be within an immediate vicinity of a camera. The immediate vicinity of the camera can range from, for example, approximately 1 millimeter to approximately 1 centimeter around a camera. In another embodiment, the display elements that are suspended includes an entire display.

The processor can cause an electric charge of the one or more thin-film transistors to rapidly change from a first state (e.g., 1 causing an "on" state) to a second state (e.g., 0 causing an "off" state) and back to a first state (e.g., 1 again). Causing the electric charge of the thin-film transistors to rapidly change from one state to another and back again can be used to turn a display off (or any portion of a display off) for such a short period of time that a viewer cannot perceive that the display (or any portion thereof) is turned off. For example, the display can be turned off for a time period of 1/60th of a second. Other time period examples include several hundredths of a second, several milliseconds, several microseconds, etc.

Step 1820 involves initiating a camera to capture an image during the period of time the backlight source is suspended. The camera is disposed beneath the CF layer. The camera is disposed proximately to the display layer (e.g., LCD layer). The camera includes a plurality of pixels corresponding to a plurality of color regions associated with the CF layer. Each pixel in the plurality of pixels is optimized to record a colored light beam passing through a color region associated with the CF layer. Each pixel in the plurality of pixels comprises a lens and a photodetector. The camera can include a plurality of photodetectors corresponding to a plurality of lenses. The lens associated with the pixel is optimized to focus the colored light beam.

Figure 19:
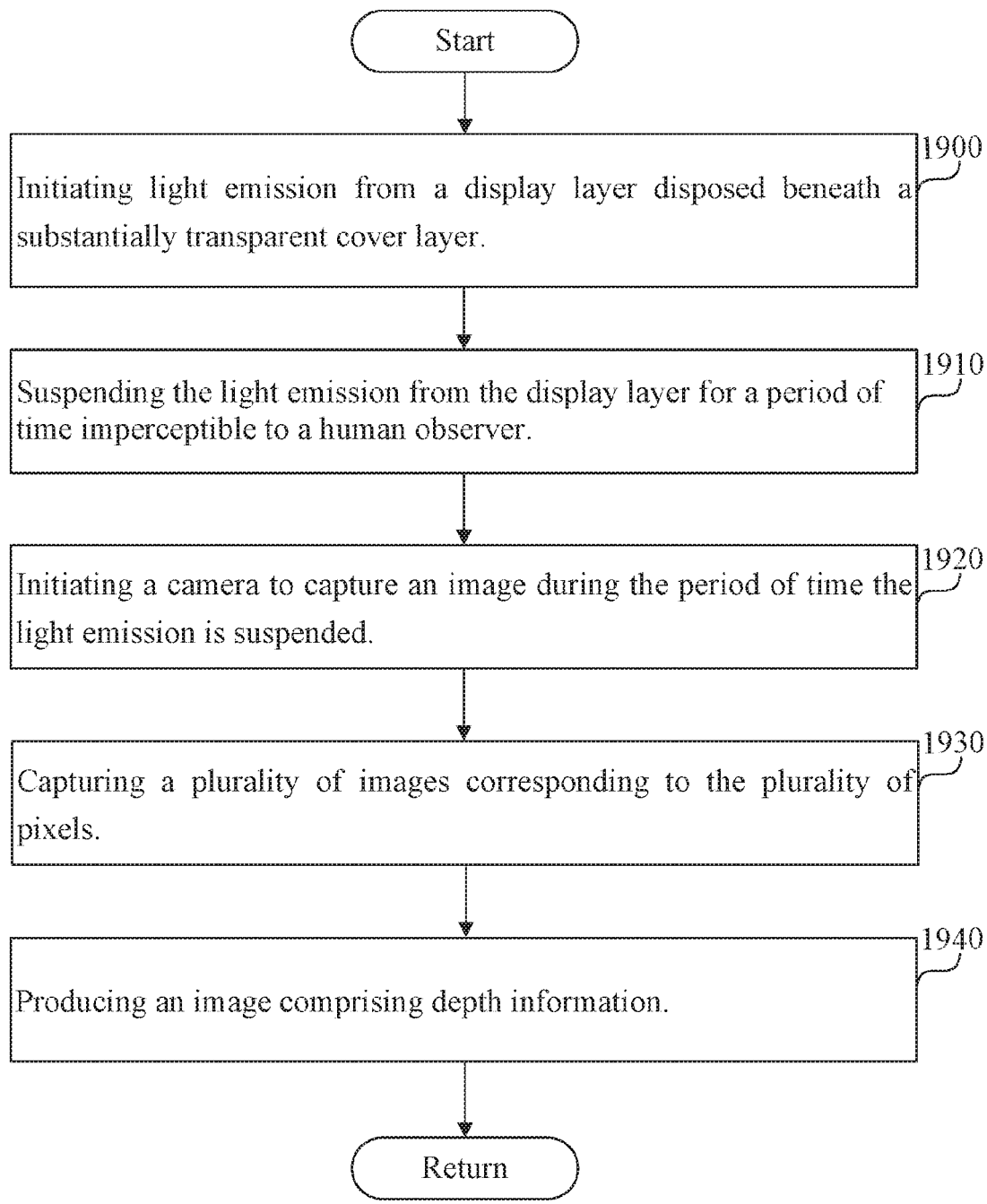
FIG. 19 is a flowchart of a method to modulate a backlight, according to one embodiment.

FIG. 19 is a flowchart of a method to modulate a backlight, according to one embodiment. The method can include initiating light emission from a display layer disposed beneath a substantially transparent cover layer (step 1900), suspending the light emission from the display layer for a period of time imperceptible to a human observer (step 1910), initiating a camera to capture an image during the period of time the light emission is suspended (step 1920), capturing a plurality of images corresponding to the plurality of pixels (step 1930), and producing an image comprising depth information (step 1940).

Step 1900 involves initiating light emission from a display layer disposed beneath a substantially transparent cover layer. The display layer can be disposed beneath a color filter (CF) layer as described above with respect to FIGS. 8A-8B. The display layer can include, for example, an LCD layer, LED layer (e.g., OLED or QLED), or a combination thereof.

In an embodiment, the display layer includes an LCD display layer. The LCD layer comprises an LCD substrate and a plurality of liquid crystals disposed on the LCD substrate. The plurality of liquid crystals is configured to assume a first arrangement and a second arrangement. The light emitted from the backlight source is transmitted through the first arrangement and blocked by the second arrangement.

In an embodiment, the display layer includes an organic light emitting diode (OLED) layer. The OLED layer can be disposed beneath the CF layer. The OLED layer includes an OLED substrate and a plurality of OLEDs disposed on the OLED substrate.

In an embodiment, the display layer includes a quantum-dot-based light emitting diode (QLED) layer. The QLED layer can be disposed beneath the CF layer. The QLED layer includes a QLED substrate and a plurality of QLEDs disposed on the QLED substrate.

Step 1910 involves suspending the light emission from the display layer for a period of time imperceptible to a human observer. Light emission can be temporarily suspended to improve a quality of image(s) captured by a camera integrated in the display. The light emission can be suspended for a short period of time (e.g., 1/60 of a second) to reduce or eliminate perceptibility of the suspension of light by a human observer. A human observer may not be able to perceive with natural senses alone suspension of light from the display for a time period under 1/60 of a second. Embodiments include time periods less than 1/60 of a second including, for example, a period of time ranging from approximately 1 microsecond to approximately 1/60th of a second and ranges therebetween.

A processor can be electrically connected to a thin-film transistor layer. One or more display elements (e.g., a single LED or group of LEDs) can be controlled by a thin-film transistor. One or more thin-film transistors can be manipulated to cause display elements to quickly turn off and on again when a camera is engaged (e.g., camera icon selected by a user). Causing the thin-film transistor(s) to suspend light emission for display element(s) can be in response to a camera selection by a user. For example, a user can select a camera icon associated with capturing a phone and in response to the selection, the processor can cause the thin-film transistor(s) to suspend light emission from the display element(s). In an embodiment, the display elements that are suspended can be within an immediate vicinity of a camera. The immediate vicinity of the camera can range from, for example, approximately 1 millimeter to approximately 1 centimeter around a camera. In another embodiment, the display elements that are suspended includes an entire display.

Step 1920 involves initiating a camera to capture an image during the period of time the light emission is suspended. The camera is disposed beneath the CF layer. The camera is disposed proximately to the display layer (e.g., LCD layer). The camera includes a plurality of pixels corresponding to a plurality of color regions associated with the CF layer. Each pixel in the plurality of pixels is optimized to record a colored light beam passing through a color region associated with the CF layer. Each pixel in the plurality of pixels comprises a lens and a photodetector. The camera can include a plurality of photodetectors corresponding to a plurality of lenses. The lens associated with the pixel is optimized to focus the colored light beam.

Step 1930 involves capturing a plurality of images corresponding to the plurality of pixels. The plurality of pixels are described above with respect to FIGS. 6A-6B. Each pixel in the plurality of pixels includes a lens and a photodetector. A processor gathers a plurality of images corresponding to the plurality of pixels to produce an image comprising depth information.

A processor compiles a plurality of captured images and identifies one or more objects in the images. The images can be captured by a plurality of photodetectors or a single photodetector capturing images in a plurality of positions. The plurality of images are captured from different positions enabling the processor to compare images to identify angular changes of identified object(s) among the plurality of images. The processor parses the plurality of images (or the produced image comprising the depth information) by identifying angular relationships between one or more identified objects. The processor generates a first image having a first angular disposition and a second image having a second angular disposition. The first and second angular disposition are based on a pre-determined position of a viewer's first and second eye, respectively.

Step 1940 involves producing an image comprising depth information. The image comprising depth information can be, for example, a stereoscopic image. The produced image can be a composite image including portions of captured images. The produced image can be optically parsed into a first image having a first angular disposition and a second image having a second angular disposition. The first image having the first angular disposition can be oriented such that identified objects are portrayed as corresponding to a viewing angle of a first eye of a viewer. The second image having the second angular disposition can be oriented such that identified objects are portrayed as corresponding to a viewing angle of a second eye of a viewer. The processor can cause display layer to display the image comprising depth information by causing the display element to project the first image toward a viewer's first eye and the second image toward the viewer's second eye. Splicing the image comprising depth information into two images and separately displaying the images to a viewer's eyes can provide a stereoscopic effect. The images are independently directed to each of a viewer's eyes by utilizing a plurality of lenses integrated into the display and configured to project an image toward a user's eye a predicted distance (e.g., 60 centimeters) from the display.

Computer

Figure 20:
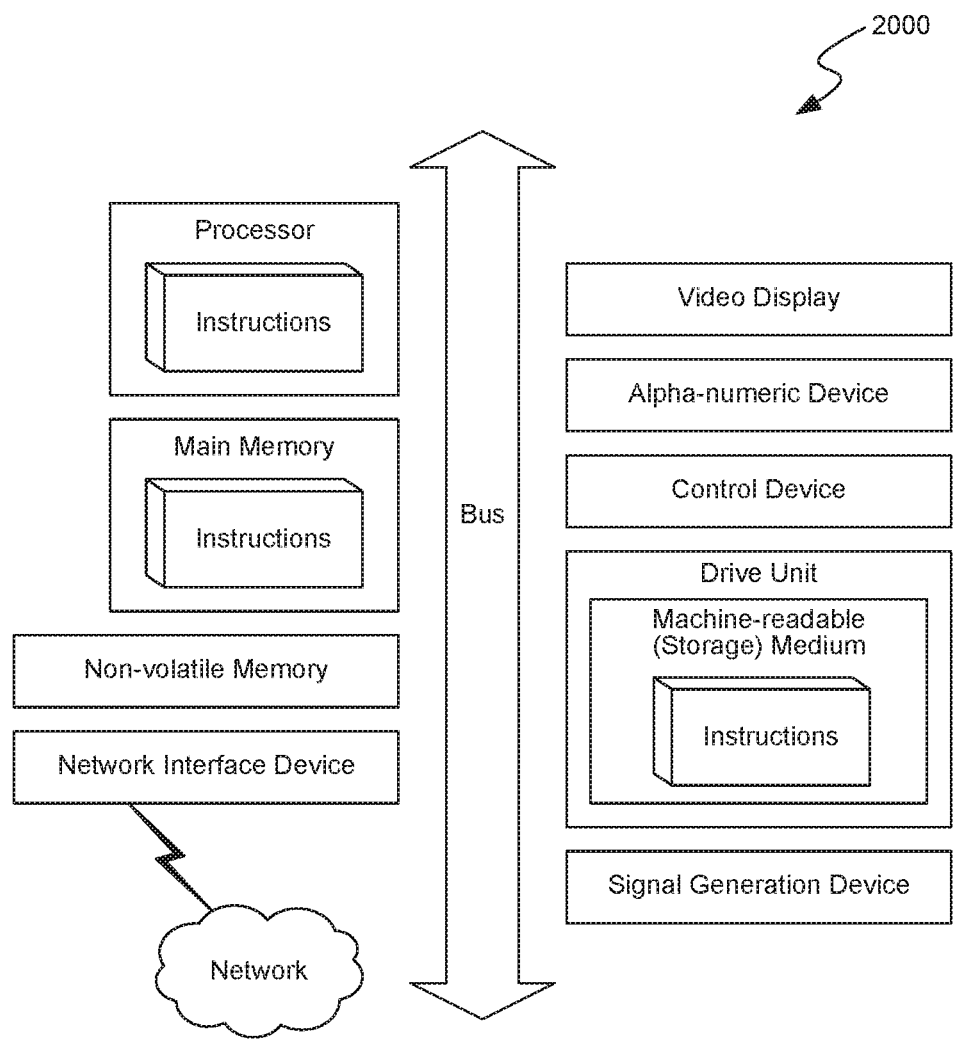
FIG. 20 is a diagrammatic representation of a machine in the example form of a computer system 2000 within which a set of instructions, for causing the machine to perform any one or more of the methodologies or modules discussed herein, may be executed.

FIG. 20 is a diagrammatic representation of a machine in the example form of a computer system 2000 within which a set of instructions, for causing the machine to perform any one or more of the methodologies or modules discussed herein, may be executed.

In the example of FIG. 20, the computer system 2000 includes a processor, memory, non-volatile memory, and an interface device. Various common components (e.g., cache memory) are omitted for illustrative simplicity. The computer system 2000 is intended to illustrate a hardware device on which any of the components described in the example of FIGS. 1-19 (and any other components described in this specification) can be implemented. The computer system 2000 can be of any applicable known or convenient type. The components of the computer system 2000 can be coupled together via a bus or through some other known or convenient device.

This disclosure contemplates the computer system 2000 taking any suitable physical form. As example and not by way of limitation, computer system 2000 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 2000 may include one or more computer systems 2000; be unitary or distributed; span multiple locations; span multiple machines; or reside in a cloud, which may include one or more cloud components in one or more networks. Where appropriate, one or more computer systems 2000 may perform without substantial spatial or temporal limitation one or more steps of one or more methods described or illustrated herein. As an example and not by way of limitation, one or more computer systems 2000 may perform in real time or in batch mode one or more steps of one or more methods described or illustrated herein. One or more computer systems 2000 may perform at different times or at different locations one or more steps of one or more methods described or illustrated herein, where appropriate.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 2000. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, storing an entire large program in memory may not even be possible. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system 2000. The interface can include an analog modem, ISDN modem, cable modem, token ring interface, satellite transmission interface (e.g. "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 14 reside in the interface.

In operation, the computer system 2000 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux™ operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment, or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies or modules of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD-ROMS), Digital Versatile Disks, (DVDs), etc.), among others, and transmission type media such as digital and analog communication links.

In some circumstances, operation of a memory device, such as a change in state from a binary one to a binary zero or vice versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice versa. The foregoing is not intended to be an exhaustive list in which a change in state for a binary one to a binary zero or vice versa in a memory device may comprise a transformation, such as a physical transformation. Rather, the foregoing is intended as illustrative examples.

A storage medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

Remarks

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling others skilled in the relevant art to understand the claimed subject matter, the various embodiments, and the various modifications that are suited to the particular uses contemplated.

While embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Although the above Detailed Description describes certain embodiments and the best mode contemplated, no matter how detailed the above appears in text, the embodiments can be practiced in many ways. Details of the systems and methods may vary considerably in their implementation details, while still being encompassed by the specification. As noted above, particular terminology used when describing certain features or aspects of various embodiments should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless those terms are explicitly defined herein. Accordingly, the actual scope of the invention encompasses not only the disclosed embodiments, but also all equivalent ways of practicing or implementing the embodiments under the claims.

The language used in the specification has been principally selected for readability and instructional purposes, and it may not have been selected to delineate or circumscribe the inventive subject matter. It is therefore intended that the scope of the invention be limited not by this Detailed Description, but rather by any claims that issue on an application based hereon. Accordingly, the disclosure of various embodiments is intended to be illustrative, but not limiting, of the scope of the embodiments, which is set forth in the following claims.

The invention claimed is:

1. A method of capturing an image, comprising:
   initiating, by a processor, light emission from a backlight source to illuminate a liquid crystal display (LCD) layer disposed beneath a color filter (CF) layer and a substantially transparent cover layer,
      wherein the LCD layer comprises an LCD substrate and a plurality of liquid crystals disposed on the LCD substrate, the plurality of liquid crystals configured to assume a first arrangement and a second arrangement,
      wherein the light emitted from the backlight source is transmitted through the first arrangement and blocked by the second arrangement;
   suspending, by the processor, the light emission from the backlight source for a period of time imperceptible to a human observer; and
   initiating, by the processor, a camera to capture an image during the period of time the backlight source is suspended,
      wherein the camera is disposed beneath the CF layer, and proximate to the LCD layer, the camera comprising a plurality of pixels corresponding to a plurality of color regions associated with the CF layer,
      wherein each pixel in the plurality of pixels is optimized to record a colored light beam passing through a color region associated with the CF layer,
      wherein each pixel in the plurality of pixels comprises a lens and a photodetector, wherein the lens associated with the pixel is optimized to focus the colored light beam.

2. The method of claim 1, wherein the period of time comprises less than 1/60 of a second.

3. The method of claim 1, wherein suspending the light emission comprises causing a thin film transistor layer electrically connected to the LCD layer to deactivate and reactivate the LCD layer by substantially simultaneously altering a charge state of a plurality of thin-film transistors of the thin film transistor layer.

4. The method of claim 1, wherein the plurality of pixels comprise a plurality of noncontiguous pixel regions.

5. The method of claim 1, wherein a thin film transistor (TFT) layer is disposed beneath the substantially transparent cover layer, the TFT layer comprising a TFT substrate and a plurality of TFTs disposed on the TFT substrate.

6. A method of capturing an image, comprising:
   initiating, by a processor, light emission from a backlight source to illuminate a display layer disposed beneath a color filter (CF) layer and a substantially transparent cover layer,
      wherein the display layer comprises a display substrate and a plurality of display elements disposed on the display substrate, the plurality of display elements configured to assume a first arrangement and a second arrangement,
      wherein the light emitted from the backlight source is transmitted through the first arrangement and blocked by the second arrangement;
   suspending, by the processor, the light emission from the backlight source for a period of time imperceptible to a human observer; and
   initiating, by the processor, a camera to capture an image during the period of time the backlight source is suspended, wherein the camera is disposed beneath the CF layer, and proximate to the display layer, the camera comprising a plurality of pixels corresponding to a plurality of color regions associated with the CF layer, wherein each pixel in the plurality of pixels is optimized to record a colored light beam passing through a color region associated with the CF layer, wherein each pixel in the plurality of pixels comprises a lens and a photodetector, wherein the lens associated with the pixel is optimized to focus the colored light beam.

7. The method of claim 6, wherein the period of time comprises less than 1/60 of a second.

8. The method of claim 6, wherein suspending the light emission comprises causing a thin film transistor layer electrically connected to the display layer to deactivate and reactivate the display layer by substantially simultaneously altering a charge state of a plurality of thin-film transistors of the thin film transistor layer.

9. The method of claim 6, wherein suspending the light emission comprises causing a subset of thin film transistors electrically connected to a subset of the display to alternate a charge state to temporarily terminate light emission for the period of time for the subset of the display.

10. The method of claim 9, wherein the subset of thin film transistors corresponds to a pixel of the plurality of pixels recording a particular section of the electromagnetic spectrum.

11. The method of claim 6, further comprising:
capturing, by the processor, a plurality of images corresponding to the plurality of pixels; and
producing, by the processor, an image comprising depth information.

12. The method of claim 6, wherein the display layer comprises an organic light emitting diode (OLED) layer disposed beneath the CF layer, the OLED layer comprising an OLED substrate and a plurality of OLEDs disposed on the OLED substrate.

13. The method of claim 6, wherein the display layer comprises quantum-dot-based light emitting diode (QLED) layer disposed beneath the CF layer, the QLED layer comprising a QLED substrate and a plurality of QLEDs disposed on the QLED substrate.

14. The method of claim 6, the display layer comprising a liquid crystal display (LCD) layer disposed beneath the CF layer, the LCD layer comprising an LCD substrate and a plurality of liquid crystals disposed on the LCD substrate, the plurality of liquid crystals configured to assume a first arrangement and a second arrangement, wherein the first arrangement transmits light, and wherein the second arrangement blocks light.

15. A system for capturing an image, comprising:
a substantially transparent cover layer defining an outside surface associated with a display;
a display layer comprising a display substrate and a plurality of display elements disposed beneath the substantially transparent cover layer, the plurality of display elements configured to transmit light;
a transparent thin film transistor (TFT) layer disposed beneath the substantially transparent layer comprising a TFT substrate and a plurality of TFTs disposed on the TFT substrate;
a camera disposed beneath the display layer, the camera comprising a plurality of pixels corresponding to a plurality of color regions;
a processor electrically connected to the TFT layer configured to:
initiate light emission from the plurality of display elements;
suspend the light emission from the plurality of display elements for a period of time imperceptible to a human observer;
initiate the camera to capture an image during the period of time the plurality of display elements are suspended;
capture a plurality of images corresponding to the plurality of pixels; and
produce an image comprising depth information.

16. The system of claim 15, wherein the camera includes a first photodetector a distance apart from a second photodetector.

17. The system of claim 16, further comprising:
identifying one or more objects in an image; and
determining the depth information associated with the one or more objects based on the distance between the first photodetector and the second photodetector.

18. The system of claim 15, the processor further configured to:
directionally parse the produced image comprising the depth information by identifying angular relationships between one or more objects identified in the produced image; and
generate a first image having a first angular disposition and a second image having a second angular disposition, the first and second angular disposition based on a predicted position of a viewer's first and second eye, respectively.

19. The system of claim 18, the processor further configured to:
display the image comprising the depth information by causing the display element to project the first image toward a predicted location of a viewer's first eye and the second image toward a predicted location of the viewer's second eye.

20. The system of claim 15, wherein suspending the light emission comprises causing a subset of thin film transistors electrically connected to a subset of the display to alternate a charge state to temporarily terminate light emission for the period of time for the subset of the display.

* * * * *